(12) United States Patent
Yamasaki

(10) Patent No.: US 7,391,240 B2
(45) Date of Patent: Jun. 24, 2008

(54) CLOCK ANOMALY DETECTION CIRCUIT AND CLOCK ANOMALY DETECTION METHOD

(75) Inventor: Shosaku Yamasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 11/503,169

(22) Filed: Aug. 14, 2006

(65) Prior Publication Data

US 2007/0262824 A1 Nov. 15, 2007

(30) Foreign Application Priority Data

Apr. 26, 2006 (JP) .............................. 2006-122155

(51) Int. Cl.
*H03K 5/19* (2006.01)
(52) U.S. Cl. ............................. 327/20; 331/74
(58) Field of Classification Search .................. 327/20, 327/34; 331/74
See application file for complete search history.

(56) References Cited

U.S. PATENT DOCUMENTS 5,523,708 A * 6/1996 Yamasaki .................... 327/20
6,184,719 B1 * 2/2001 Tailliet ........................ 327/34
6,469,544 B2 * 10/2002 Kimura ....................... 327/20
6,765,954 B1 * 7/2004 Eichrodt et al. ............. 375/220

FOREIGN PATENT DOCUMENTS

JP 09-244761 9/1997
JP 11-355110 12/1999

* cited by examiner

*Primary Examiner*—Joseph Chang
(74) *Attorney, Agent, or Firm*—Staas & Halsey LLP

(57) ABSTRACT

A clock anomaly detection circuit includes: a dividing unit configured to output a divided target clock by dividing frequency of a target clock; a first time width measurement unit configured to obtain values of the divided target clock using rising edges of a monitoring clock that is synchronized with the target clock, and to measure an H level time with and an L level time width; a second time width measurement unit configured to obtain values of the divided target clock using falling edges of the monitoring clock, and to measure an H level time with and an L level time width; and an anomaly determination unit configured to determine that the target clock is abnormal when an anomaly is detected in the H level time width or the L level time width measured in the first time width measurement unit and when an anomaly is detected in the H level time width or the L level time width measured in the second time width measurement unit.

8 Claims, 25 Drawing Sheets

CLOCK ANOMALY DETECTION CIRCUIT AND CLOCK ANOMALY DETECTION METHOD

BACKGROUND OF THE INVENTION

1. Field of the Invention

The present invention relates to a technology for detecting an anomaly state such as clock disturbance in a digital circuit that operates based on a clock provided from an external oscillator.

2. Description of the Related Art

As a conventional technology for detecting anomaly of a clock, there is a method shown in FIG. 1, for example. In this method, presence or absence of a clock edge within a predetermined monitoring period is monitored. When no clock edge is found in the monitoring period, it is determined that clock interruption occurs so as to output an alarm. After that, when at least a clock edge is found within the monitoring period, the alarm is released.

FIG. 2 shows an example of a circuit for realizing this clock anomaly detection method. FIG. 3 shows an operation time chart of the circuit. This circuit includes an FF (flip-flop) 1, an FF 2, an FF 3, and an OR circuit 4. An interruption detection target clock is received by a CL terminal of the FF 1, and an inversion of the interruption detection target clock is received by a CL terminal of the FF 2. D terminals of the FF 1 and the FF 2 always receive H level and CK clocks receives a monitoring timer signal.

As shown in FIG. 3, when the interruption detection target clock is normal, output values of the FF 1 and the FF 2 are always cleared. Therefore, outputs of the FF 1 and the FF 2 become L even when the monitoring timer is H. After the interruption detection target clock is interrupted (at A point), the outputs of the FF 1 and the FF 2 are not cleared by the interruption detection target clock. Thus, when the monitoring timer becomes H, H is held. In addition, when the monitoring timer becomes H at the time of B, output of the FF 3 becomes H so that an alarm is output. After that, when the interruption detection target clock is restored, outputs of the FF 1 and the FF 2 become L, and the output of FF 3 becomes L at a time when the monitoring timer becomes H next, so that alarm output stops. Clock interruption detection can be performed according to such operation.

There are following two documents: a patent document 1 and a patent document 2 as prior art on anomaly detection of a clock.

[Patent document 1] Japanese Laid-Open Patent Application No. 09-244761

[Patent document 2] Japanese Laid-Open Patent Application No. 11-355110

In the above-mentioned conventional technology, anomaly can be detected only when any clock edge is not detected within the monitoring period, and clock interruption within a shorter period and clock disturbance that is an metastable state of clock period cannot be detected. Therefore, in the conventional technology, when there occurs an anomaly due to clock disturbance, there is a problem in that it takes long time to specify whether the anomaly is caused by a problem in a clock system.

SUMMARY OF THE INVENTION

The present invention is contrived in view of the above-mentioned problem, and an object of the present invention is to provide a clock anomaly detection circuit that can detect clock anomaly with higher precision than a conventional interruption detection circuit that monitors anomaly of a clock system.

According to an embodiment, the object can be achieved by a clock anomaly detection circuit including:

a dividing unit configured to output a divided target clock by dividing frequency of a target clock;

a first time width measurement unit configured to obtain values of the divided target clock using rising edges of a monitoring clock that is synchronized with the target clock, and to measure an H level time width and an L level time width;

a second time width measurement unit configured to obtain values of the divided target clock using falling edges of the monitoring clock, and to measure an H level time width and an L level time width; and an anomaly determination unit configured to determine that the target clock is abnormal when an anomaly is detected in the H level time width or the L level time width measured in the first time width measurement unit and when an anomaly is detected in the H level time width or the L level time width measured in the second time width measurement unit.

According to the present invention, anomaly of a clock can be detected more precisely compared with the conventional interruption detection circuit. Especially, since the time width of H level or L level of the target clock is measured using both of the rising edge and the falling edge, influence of metastable state in obtaining the target clock can be avoided. In addition, since the frequency of the target clock is divided so as to generate the divided target clock to be monitored, influence of Duty width variation can be avoided.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

In the following, embodiments of the present invention are described with reference to figures.

(Outline)

Figure 1:
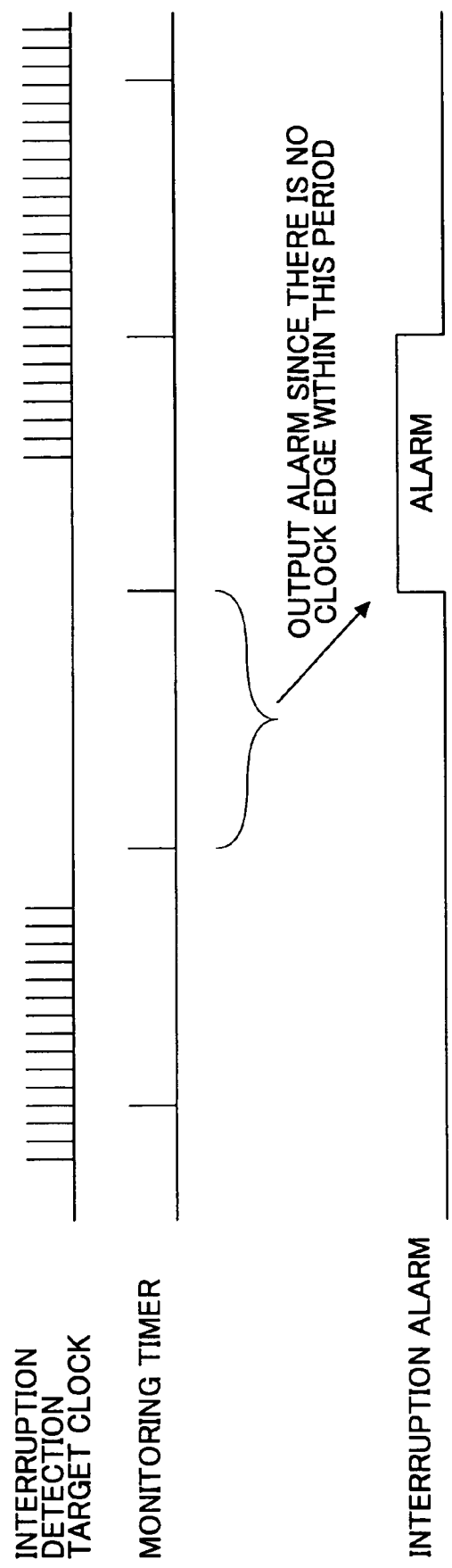
FIG. 1 is a figure for explaining an example of a conventional technology for detecting anomaly of a clock.
Figure 2:
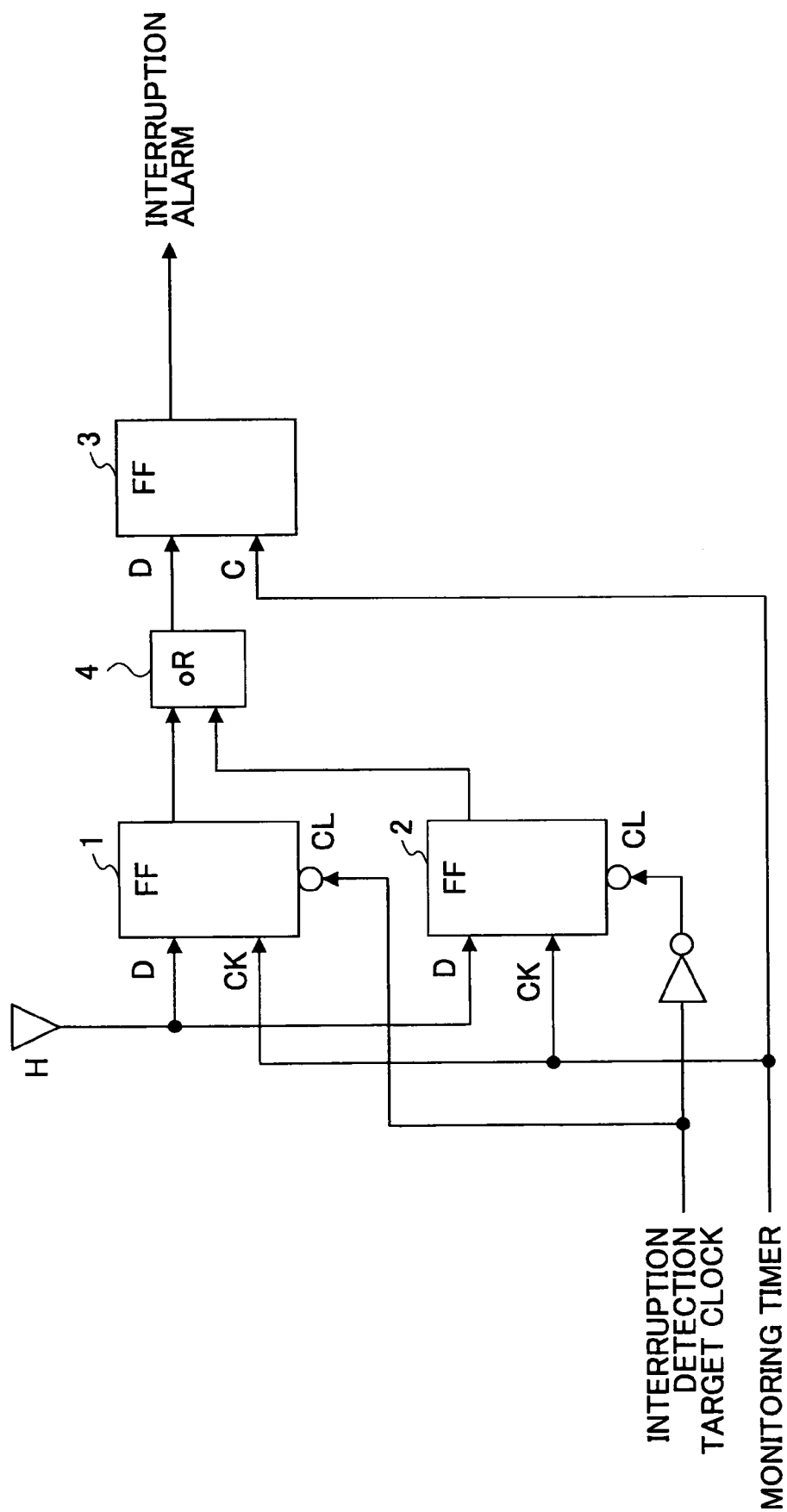
FIG. 2 is a block diagram of a clock anomaly detection circuit of the conventional technology.
Figure 3:
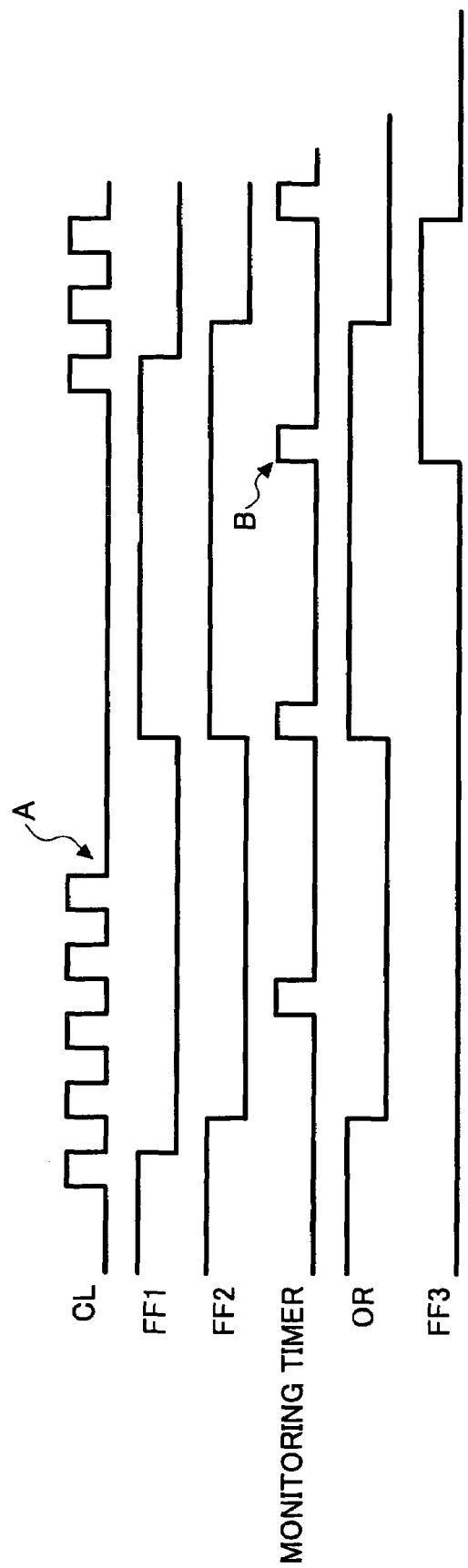
FIG. 3 is a figure for explaining operation of the clock anomaly detection circuit shown in FIG. 2.
Figure 4:
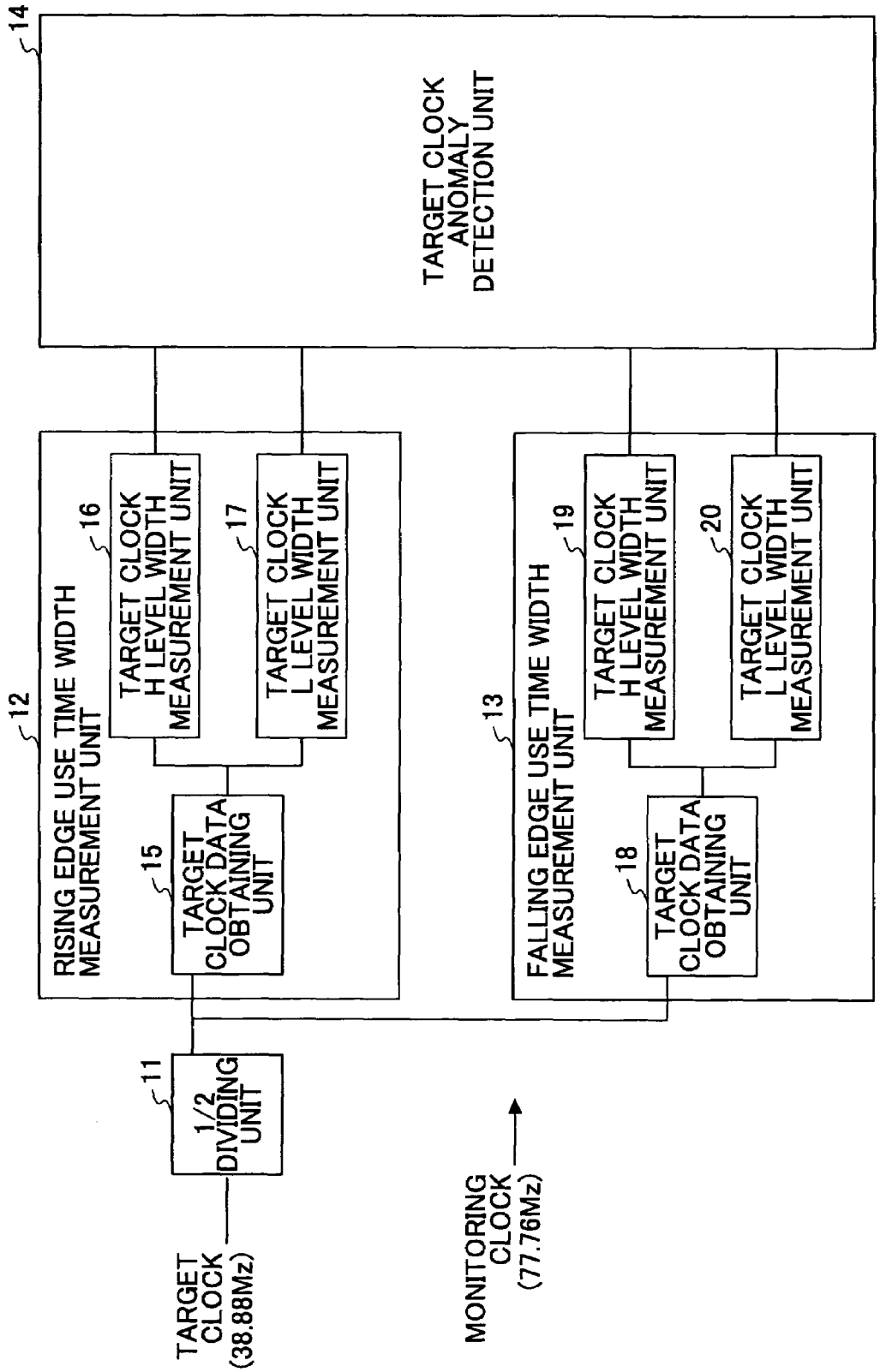
FIG. 4 is a schematic block diagram of a clock anomaly detection circuit 10 in an embodiment of the present invention.

FIG. 4 shows a schematic configuration of a clock anomaly detection circuit 10 in an embodiment of the present invention. As shown in FIG. 4, the clock anomaly detection circuit in the embodiment of the present invention includes a ½ dividing unit 11, a rising edge use time width measurement unit 12, a falling edge use time width measurement unit 13, and a target clock anomaly detection unit 14. The rising edge use time width measurement unit 12 includes a target clock data obtaining unit 15, a target clock H level width measurement unit 16, and a target clock L level width measurement unit 17. The falling edge use time width measurement unit 13 includes a target clock data obtaining unit 18, a target clock H level width measurement unit 19, and a target L level width measurement unit 20.

In this embodiment, it is assumed that frequency of the anomaly monitoring target clock (to be referred to as target clock hereinafter) is 38.88 MHz. In addition, a monitoring clock of 77.76 MHz for monitoring anomaly of the target clock is supplied to each circuit excluding the ½ dividing unit 11.

The ½ dividing unit 11 receives the target clock, and divides frequency of the target clock to half and outputs the frequency-divided target clock. The clock obtained by dividing the frequency of the target clock into half is referred to as a divided target clock hereinafter.

The target clock data obtaining unit 15 obtains a value (High (H) or Low (L)) of the input divided target clock and outputs the value using the rising edge of the monitoring clock. The target clock data obtaining unit 18 obtains a value of the input divided target clock and outputs the value using the falling edge of the monitoring clock.

The target clock H level width measurement unit 16 measures a time width of H level in a value received from the target clock data obtaining unit 15. The target clock L level width measurement unit 17 measures a time width of L level in the value received from the target clock data obtaining unit 15. The target clock H level width measurement unit 19 measures a time width of H level in the value received from the target clock data obtaining unit 18. The target clock L level width measurement unit 20 measures a time width of L level in the value received from the target clock data obtaining unit 18.

The clock anomaly detection unit 14 monitors time width data output from the target clock H level width measurement units 16 and 19, and target clock L level width measurement units 17 and 20 using a time window corresponding to a predetermined number of monitoring clocks, and the clock anomaly detection unit 14 outputs an alarm when there is anomaly in the target clock.

(Principle of Operation)

Next, the principle of operation of the clock anomaly detection circuit 10 having the configuration of FIG. 4 is described. In this embodiment, it is defined that anomaly (disturbance, clock interruption, or the like) occurs when there is period variation of no less than ±6.43 ns in the 38.88 MHz clock. Therefore, the clock anomaly detection circuit 10 uses a monitoring clock of 77.76 MHz that can monitor the period variation of ±6.43 ns. In addition, it is assumed that the target clock and the monitoring clock are synchronized with each other, namely, phase relationship of them does not change.

First, the most basic operation of the clock anomaly detection circuit 10 is described with reference to a time chart shown in FIG. 5.

Figure 5:
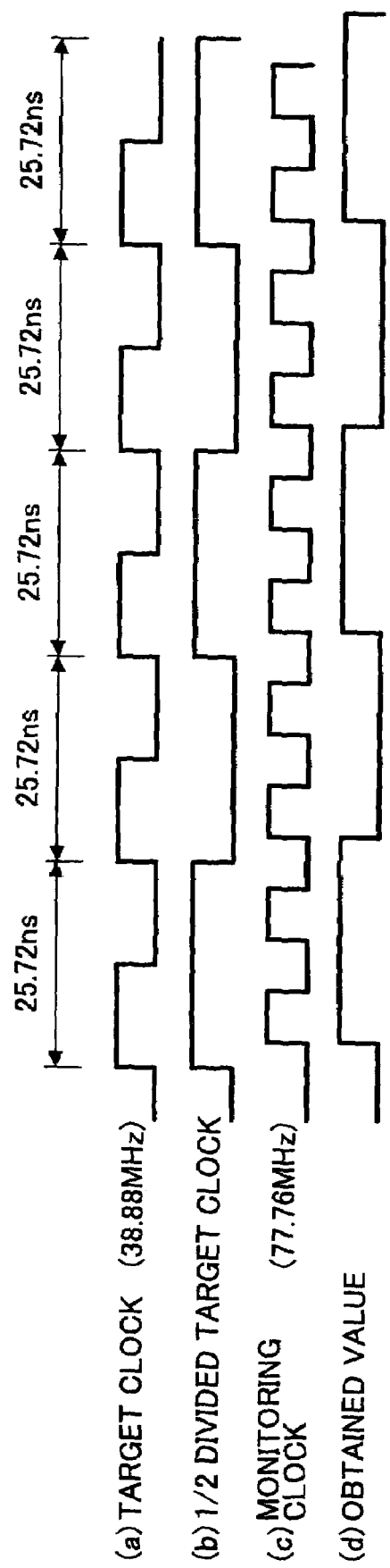
FIG. 5 is a time chart for explaining basic operation of the clock anomaly detection circuit 10.

The reference sign (a) in FIG. 5 indicates the target clock before being divided, (b) indicates the divided target clock obtained by dividing the target clock into half, (c) indicates the monitoring clock. In this embodiment, the clock anomaly detection circuit 10 basically monitors a time width of H level and a time width of L level in the value (d) of the divided target clock obtained by using the rising edge or the falling edge of the monitoring clock, and detects anomaly of the time width so as to detect disturbance of the clock.

Figure 6:
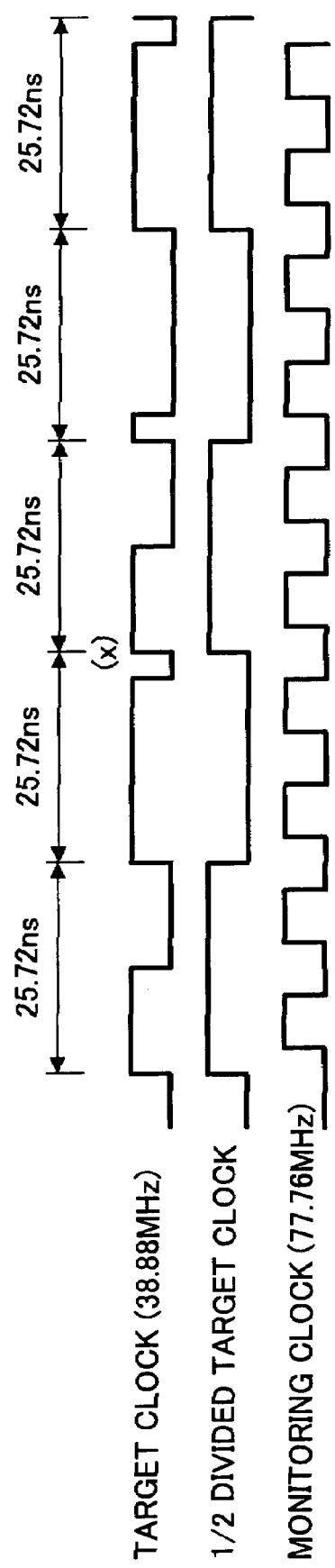
FIG. 6 is a time chart when Duty width variation exists in the target clock.

In this embodiment, the target clock is divided into half. The reason is as follows. As in the case of the target clock shown in FIG. 6, there is a case where there is no frequency variation in the target clock but the Duty width is changed. If the target clock is directly monitored without dividing in this case, adjacent edges (indicated as (x) in FIG. 6) of the target clock may exist between adjacent edges of the monitoring clock so that the (x) part cannot be detected. Accordingly, there is a possibility that it is erroneously determined that there is period variation even when such period variation does not exist actually. Therefore, in this embodiment, the target clock is divided into half to delete the variation of the Duty width so that anomaly monitoring is performed for the clock from which the variation of the Duty width is eliminated. Thus, it becomes possible not to detect disturbance in the case in which frequency is normal but only the Duty width changes.

In addition, irrespective of the speed of the target clock, by dividing the frequency of the clock into a speed for which anomaly can be detected with both edges of the monitoring clock, the disturbance and the like can be detected. Also in this point, it has importance to divide the frequency of the target clock.

Figure 7:
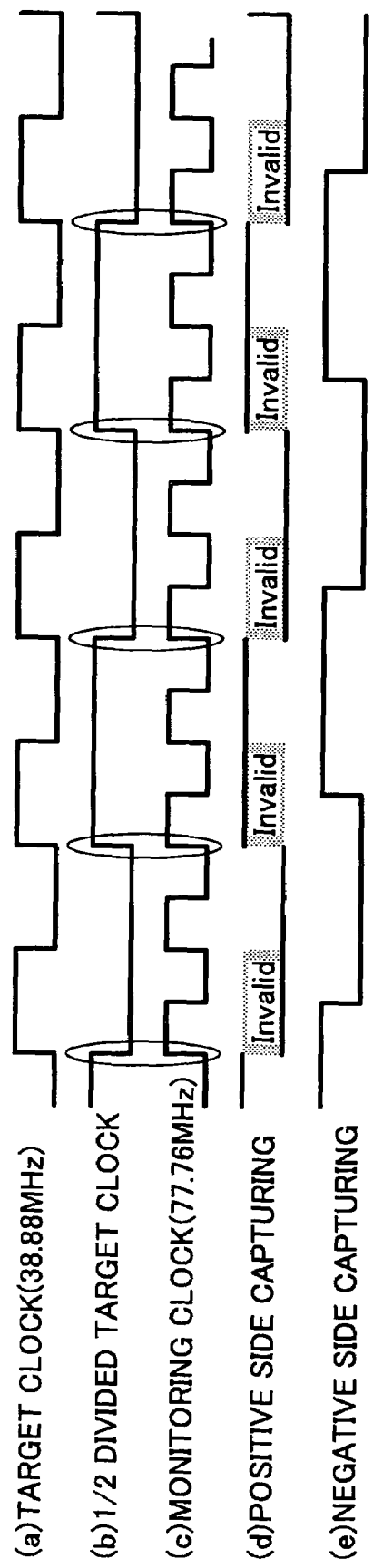
FIG. 7 is a figure for explaining metastable state.

By the way, as shown in (d) of FIG. 7, when obtaining the value of the divided target clock with the edge of the monitoring clock, metastable state occurs in which it is not determined whether to get H or L when using one edge (rising edge (positive side) in the example of FIG. 7). Therefore, erroneous decision may be made by monitoring a value obtained by using only one edge.

Thus, in this embodiment, as shown in (e) of FIG. 7, in addition to the value obtained by the rising edge of the monitoring clock, a value obtained by using the falling edge (Negative side) of the monitoring clock is used. It is because even when the metastable state occurs in one edge, a value can be obtained in another edge with reliability. That is, in this embodiment, a time width of H level and a time width of L level in each of (d) (using rising edge) and (e) (using falling edge) are monitored so as to detect anomaly of the time widths to detect disturbance of the clock. By the way, the time width is determined based on count value obtained by counting the number of monitoring clocks in the H level or L level.

In the following, anomaly detection methods are described for a case where the period of the target clock extends and for a case where the period of the target clock contracts. First, the case where the period of the target clock extends is described with reference to the time chart of FIG. 8.

Figure 8:
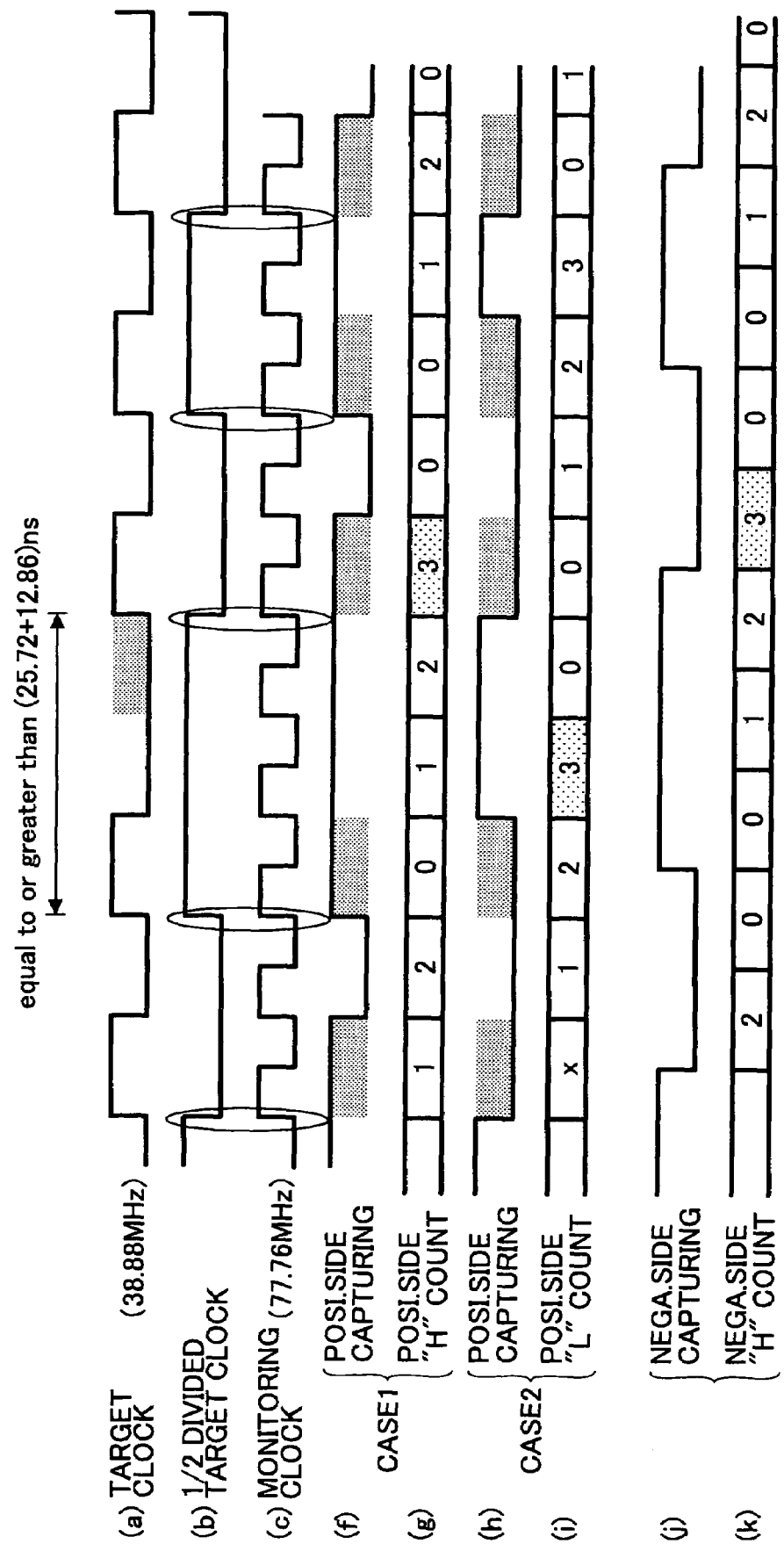
FIG. 8 is a time chart for explaining anomaly detection when the period of the target clock lengthens.

FIG. 8 shows a case in which the period of the target clock temporarily lengthens to be longer than 25.72 ns that is one period of a normal target clock so that it becomes equal to or greater than (25.72+12.86)ns.

In addition, each part enclosed by an ellipse in edges of the divided target clock and the monitoring clock indicates a part where metastable state may occur, and FIG. 8 shows case 1 in which the obtained value is H and case 2 in which the obtained value is L.

(f) indicates values of the divided target clock obtained by using the rising edges in the case 1. (g) indicates values each obtained by counting the monitoring clocks within the time width of the H level in the obtained value shown by (f).

(h) indicates values of the divided target clock obtained by using the rising edge in the case 2. (i) indicates values each obtained by counting the monitoring clocks within the time width of the L level in the obtained value shown by (h) in the case 2.

(j) indicates values of divided target clock obtained by using the falling edge. (k) indicates values of the time width of the obtained value indicated by (i) counted using the monitoring clocks.

By the way, in this embodiment, the circuit measures all of the time widths of the H and L levels of the value obtained by the rising edge, and the time widths of the H and L levels of the value obtained by the falling edge. However, FIG. 8 only shows data necessary for explaining detection examples when the period is lengthened.

In this embodiment, when both of the time width of the value (H level or L level) obtained by the rising edge and the time width of the value (H level or L level) obtained by the falling edge are abnormal, it is determined that the target clock is abnormal.

More particularly, since each of the time widths of H level and L level of the divided target clock is two periods of the monitoring clock normally, it is determined that the period of the target clock lengthens if "3" appears as the count value of the time with of H level or L level. For example, a time window of five monitoring clocks (five periods of clocks) are always monitored so that it is detected whether "3" appears in both of the time width of the value (H level or L level) obtained by the rising edge and the time width of the value (H level or L level) obtained by the falling edge in the time window. In the example of FIG. 8, since "3" appears in both of the rising edge side and the falling edge side within the time window of five clocks, it can be determined that clock disturbance in which the period lengthens occurs.

Next, a case where the period of the target clock shortens is described with reference to a time chart of FIG. 9.

Figure 9:
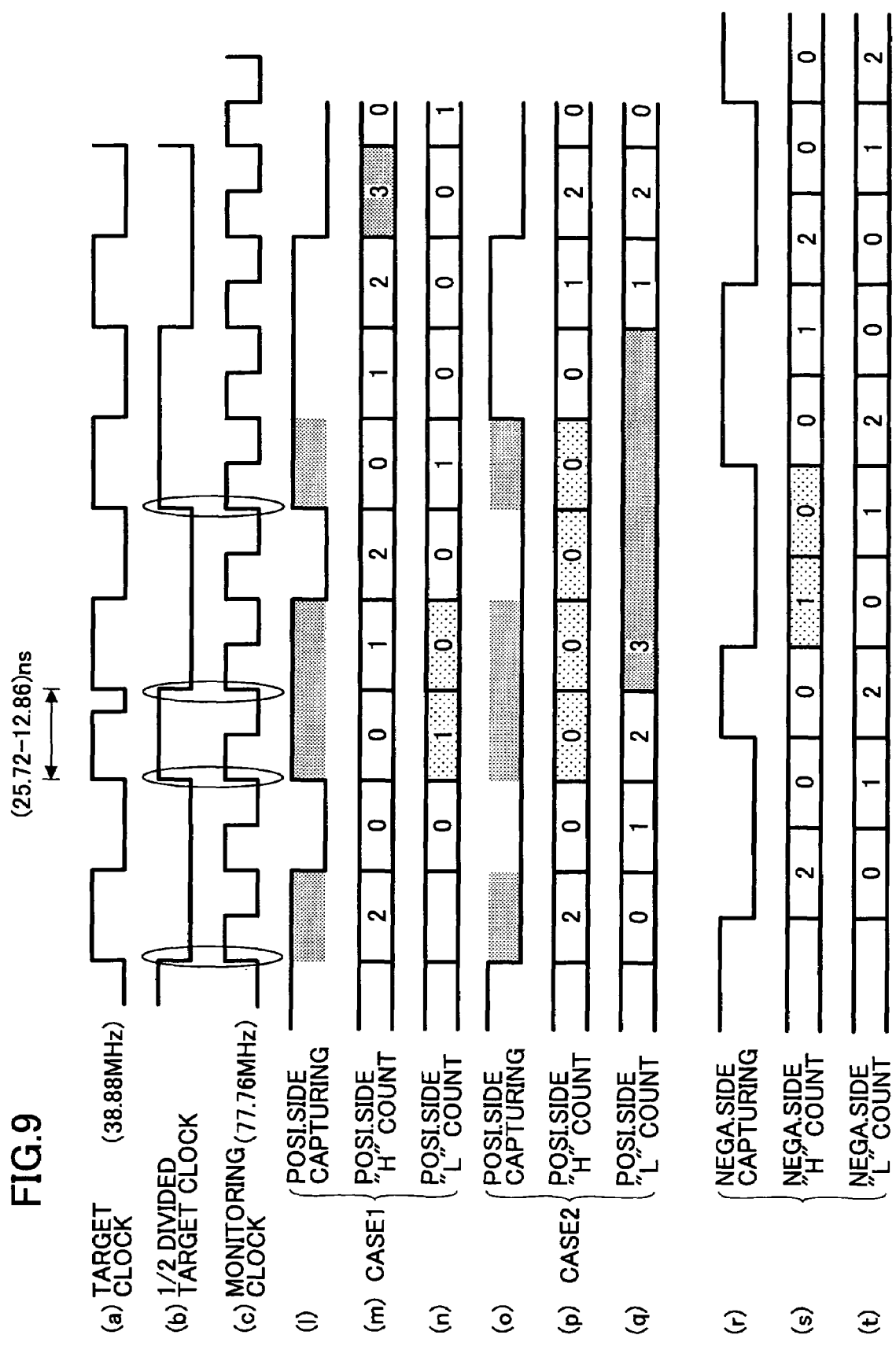
FIG. 9 is a time chart for explaining anomaly detection when the period of the target clock shortens.

FIG. 9 shows a case in which the period of the target clock temporarily shortens from 25.72 ns that is one period of a normal target clock so that it becomes equal to or shorter than (25.72-12.86)ns.

In addition, each part enclosed by an ellipse in edges of the divided target clock and the monitoring clock indicates a part where metastable state may occur, and also FIG. 9 shows case 1 in which the obtained value is H and case 2 in which the obtained value is L.

(l) indicates values of the divided target clock obtained by using the rising edge in the case 1. (m) indicates values each obtained by counting the monitoring clocks within the time width of the H level in the obtained value shown by (l). (n) indicates values, counted using the monitoring clock, of the time with of L level of the obtained value indicated by (l) in the case 1.

(o) indicates values of the divided target clock obtained by using the rising edge in the case 2. (p) indicates values each obtained by counting the monitoring clocks within the time width of the H level in the obtained value shown by (o) in the case 2. (q) indicates values, counted using the monitoring clock, of the time width of L level of the obtained value indicated by (o) in case 2.

(r) indicates values of the divided target clock obtained by using the falling edge. (s) indicates values of the time width of H level of the obtained value indicated by (r) counted using the monitoring clock. (t) indicates values, counted using the monitoring clock, of the time width of L level of the obtained value indicated by (r).

In the case where the period shortens, each of time widths of H level and L level of the divided target clock is two periods of the monitoring clock normally, so that the count value becomes "0"→"1"→"2"→"0". Therefore, when the count value of the time width of H level or L level becomes "1"→"0", it indicates anomaly. In addition, occurrence of four consecutive "0"s ("0"→"0"→"0"→"0") is abnormal.

Then, for example, a time window of four monitoring clocks are always monitored so that it is determined whether any of the above-mentioned anomalies occurs in both of the value (H level or L level) obtained by the rising edge and the value (H level or L level) obtained by the falling edge in the time window. Then, when both of them are abnormal, it can be determined that the period of the clock abnormally shortens so as to output an alarm. In the example of FIG. 9, since anomaly appears in both of the rising edge side and the falling edge side within four clocks, it can be determined that clock disturbance occurs at the time.

In the above-mentioned example, the monitoring clock of 77.76 MHz is used for detecting periodic variation equal to or greater than ±6.43 ns in the target clock of 38.88 MHz. The value 6.43 ns corresponds to a half period of 77.76 MHz (time length between adjacent rising edge and falling edge). That is, it is only necessary to use a clock, as the monitoring clock, having a period twice as long as a variation width that is required to be detected as abnormal variation.

For detecting shorter period variation, a monitoring clock having a higher frequency can be used. Thus, for example, by using a monitoring clock of frequency: 155.5 MHz that is twice as high as 77.76 MHz, frequency variation half of 6.43 ns can be detected. However, in this case, the count value for determining anomaly is different from that in the above-mentioned example. When using a monitoring clock having a frequency twice as high as 77.76 MHz, each of time widths of H level an L level of the divided target clock is four periods of the monitoring clock normally. The count value by which anomaly is determined to be exist can be determined based on this fact. For example, as to the case where the period of the target clock lengthens, it is determined that the target clock is abnormal when "5" appears in the count value. As to the case where the period of the target clock shortens, it is determined that the target clock is abnormal when the count value becomes "3"→"0".

(Detailed Configuration of Clock Anomaly Detection Circuit)

Figure 10:
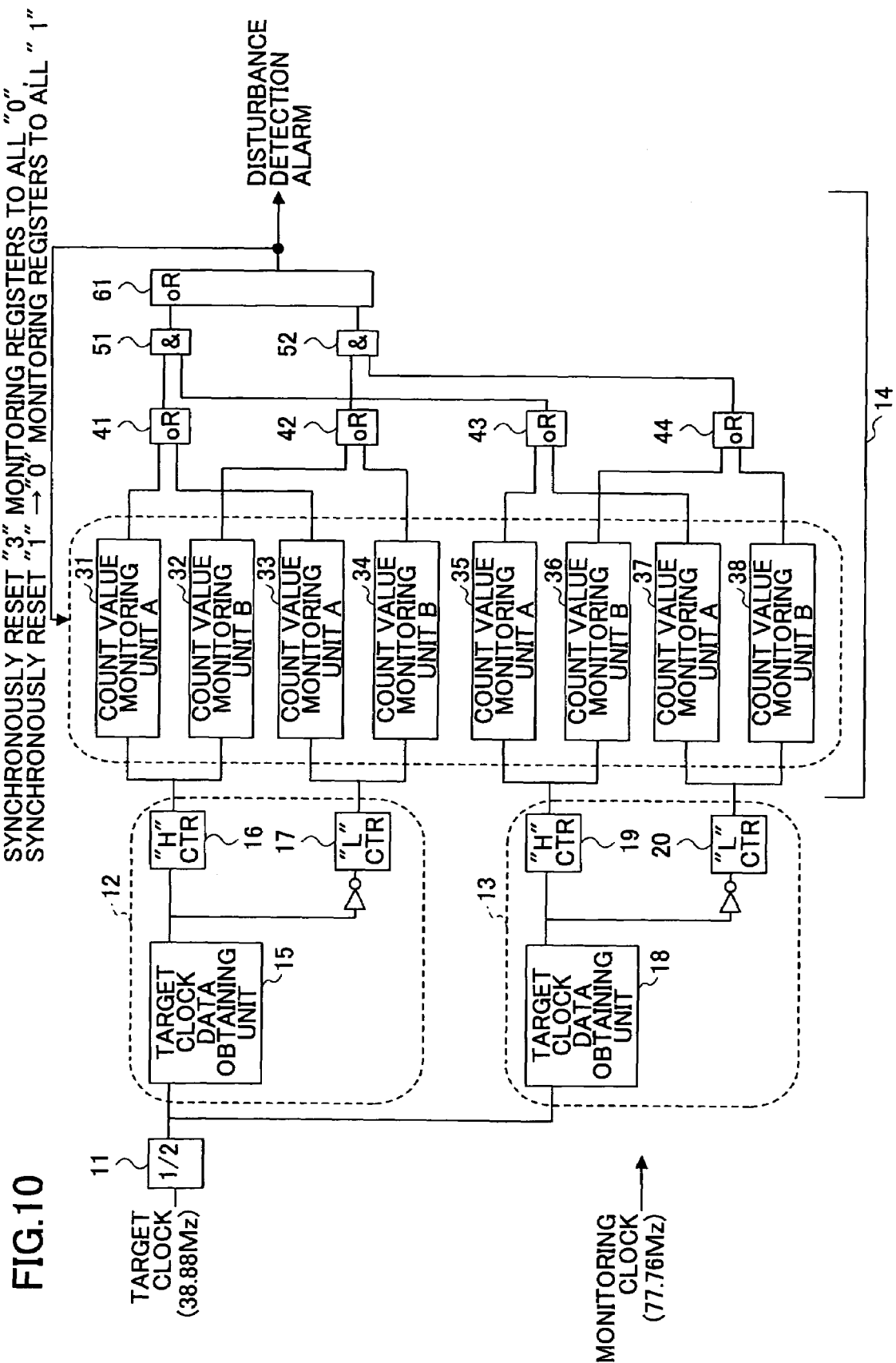
FIG. 10 is a figure showing a detailed configuration example of the clock anomaly detection circuit 10 in the embodiment of the present invention.

Next, a detailed configuration example of the clock anomaly detection circuit 10 of this embodiment is described with reference to FIGS. 10-12. FIG. 10 especially shows the clock anomaly detection unit 14 in more detail compared with FIG. 4.

In FIG. 10, the ½ dividing unit 11, the rising edge use time width measurement unit 12 and the falling edge use time width measurement unit 13 are the same as corresponding units in FIG. 4. Each of target clock data obtaining units in the rising edge use time width measurement unit 12 and the falling edge use time width measurement unit 13 can be realized by a flip-flop circuit, for example. Each of the target clock H level width measurement units 16 and 19 can be realized by using a counter circuit performing counting by using an edge of the monitoring clock. Each of the target clock L level width measurement units 17 and 20 can be realized by using an inverting circuit and a counter circuit. The target clock H level width measurement unit is called an H counter, and the target clock L level width measurement unit is called an L counter hereinafter.

As shown in FIG. 10, a count value monitoring unit A and a count value monitoring unit B are connected to each of the H counters 16 and 19 and the L counters 17 and 20. The count value monitoring unit A is a circuit for detecting the case where the H level width or the L level width lengthens to be longer than a normal value. In this embodiment, the count value monitoring unit A monitors whether "3" appears in the count value output from the H counter 16, 19 or the L counter 17, 20.

The count value monitoring unit B is a circuit for detecting the case where the H level width or the L level width shortens to be shorter than a normal value. In this embodiment, the count value monitoring unit B monitors whether the count value output from the H counter 16, 19 or the L counter 17, 20 becomes "1"→"0" or "0"→"0"→"0"→"0".

The two count value monitoring units A (31, 33) that are respectively connected to the H counter 16 and the L counter 17 that are connected to the target clock data obtaining unit 15 are connected to an OR circuit 41, and the two count value monitoring units B (32, 34) are connected to an OR circuit 42. The two count value monitoring units A (35, 37) that are respectively connected to the H counter 19 and the L counter 20 that are connected to the target clock data obtaining unit 18 are connected to an OR circuit 43, and the two count value monitoring units B (36, 38) are connected to an OR circuit 44. The OR circuit 41 in the rising edge use monitoring side and the OR circuit 43 in the falling edge use monitoring side are connected to an AND circuit 51, and the OR circuit 42 in the rising edge use monitoring side and the OR circuit 44 in the falling edge use monitoring side are connected to an AND circuit 52. Then, the AND circuit 51 and the AND circuit 52 are connected to the OR circuit 61.

In the circuit configuration, a disturbance detection alarm is output when anomaly is detected in the count value monitoring unit A (31) of H side of the rising edge use side or in the count value monitoring unit A (33) in L side and when anomaly is detected in the count value monitoring unit A (35) of H side of the falling edge use side or in the count value monitoring unit A (37) in L side. The alarm in this case means that the period of the target clock lengthens. In addition, a disturbance detection alarm is also output when anomaly is detected in the count value monitoring unit B (32) of H side of the rising edge use side or in the count value monitoring unit B (34) in L side and when anomaly is detected in the count value monitoring unit B (36) of H side of the falling edge use side or in the count value monitoring unit B (38) in L side. The alarm in this case means that the period of the target clock shortens.

Figure 11:
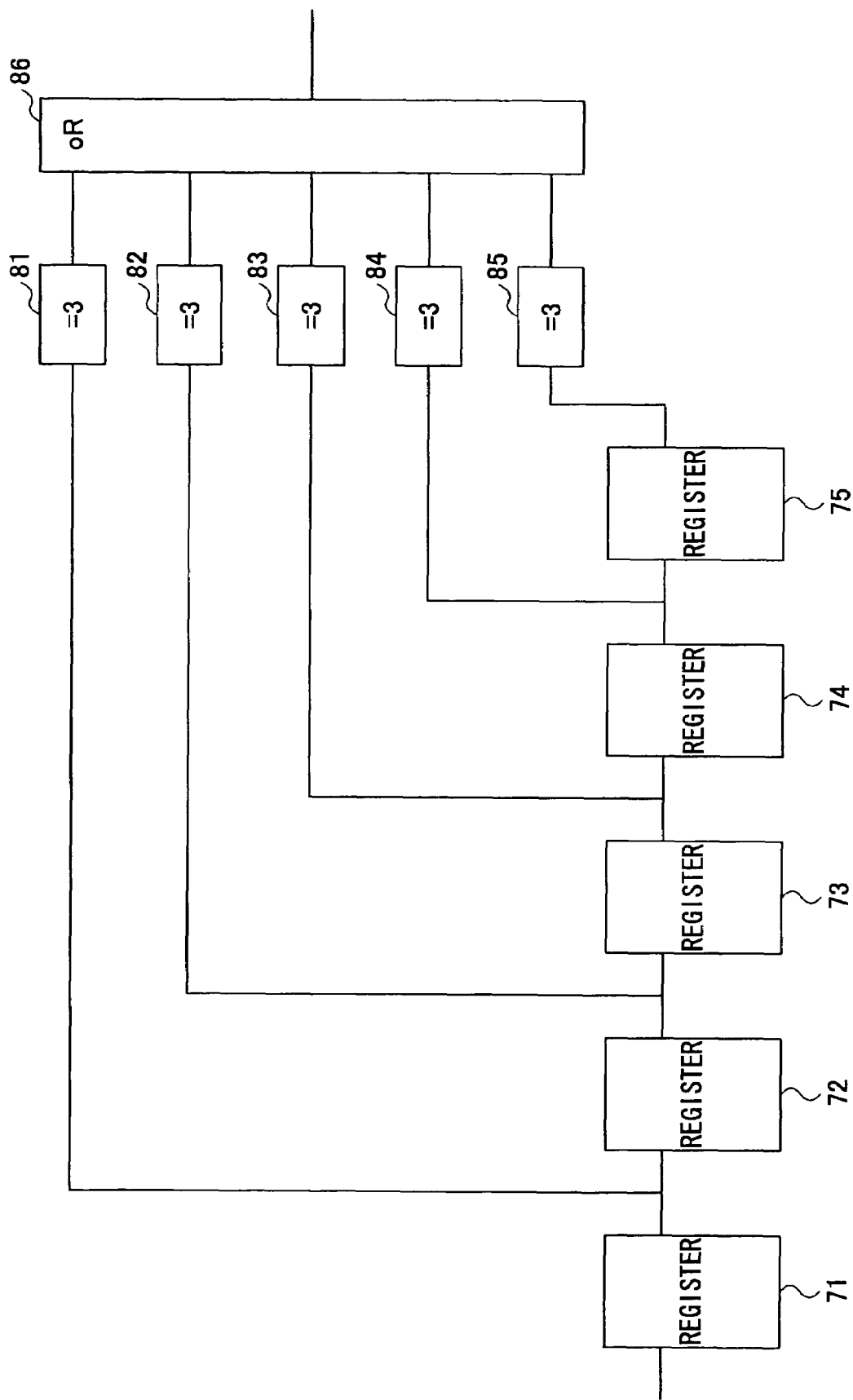
FIG. 11 shows a detailed configuration example of a count value monitoring unit A.

FIG. 11 shows a detailed configuration example of the count value monitoring unit A. As shown in FIG. 11, registers 71-74 each for holding a count value are connected with each other. "3" determination units 81-85 each for determining whether a register value is "3" are connected to outputs of the registers. Each "3" determination unit is connected to the OR circuit 86. The count value in a register shifts to a next register in synchronization with the monitoring clock. Accordingly, the count value monitoring unit A can always monitor count values of five clocks and output a signal indicating anomaly when any one of the register values is "3".

Figure 12:
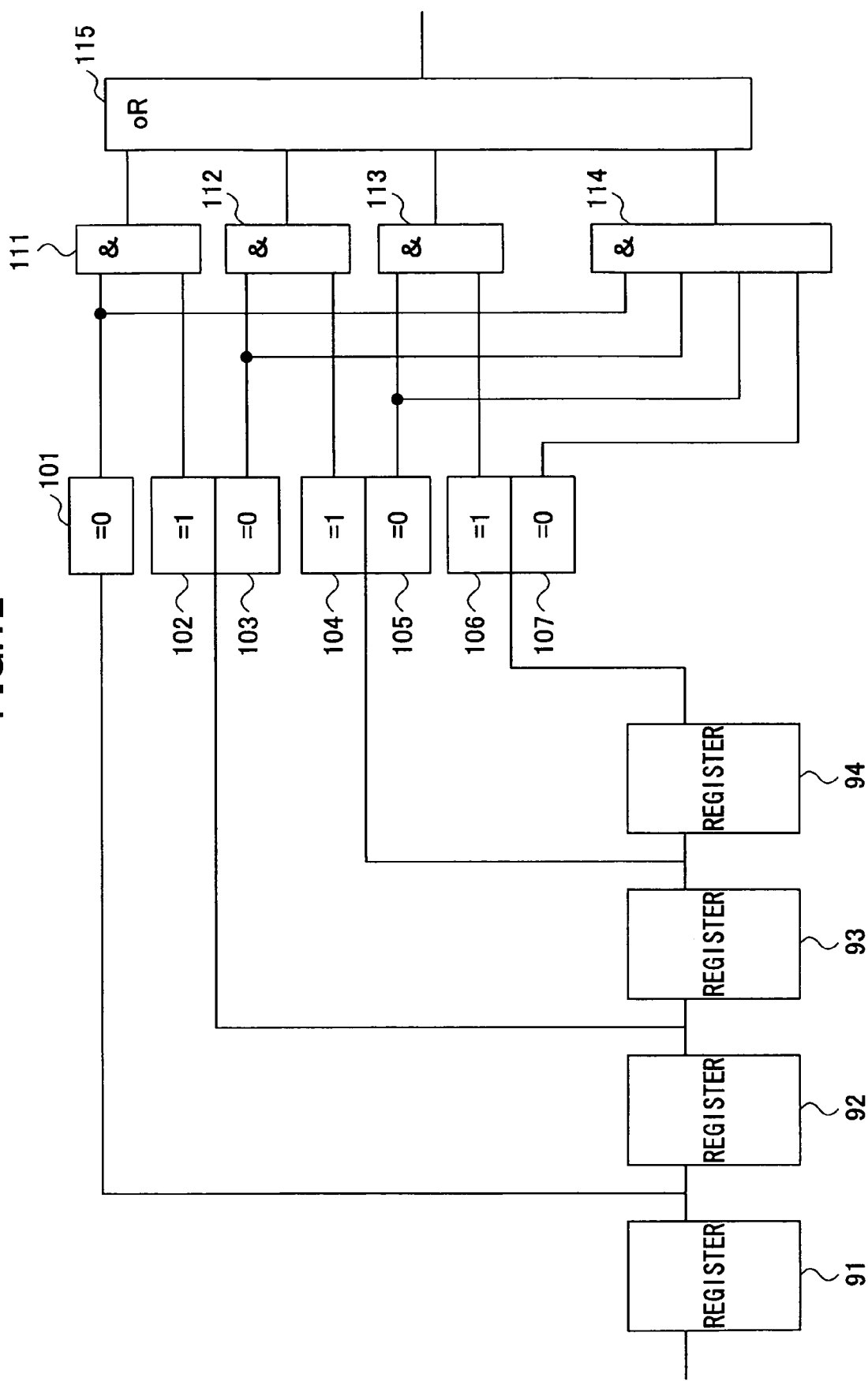
FIG. 12 shows a detailed configuration example of a count value monitoring unit B.

FIG. 12 shows a detailed configuration example of the count value monitoring unit B. As shown in FIG. 12, four registers 91-94 each for holding a count value are connected with each other. In addition, a "0" determination unit 101 for determining whether the count value is "0" is connected to the register 91. Each of the registers 92-94 is connected to a "1" determination unit for determining whether the count value is "1" and a "0" determination unit.

The "0" determination unit and the "1" determination unit corresponding to adjacent registers are connected to an AND circuit (111-113), and the four "0" determination units are connected to an AND circuit 114, and each AND circuit is connected to an OR circuit 115.

According to this circuit configuration, the count value monitoring unit B always monitors count values of four clocks and determines whether "1"→"0" occurs in the four clocks or whether all of the four clocks are "0". Then, the circuit outputs a signal indicating anomaly when any one of them occurs.

When a disturbance detection alarm is output in the circuit shown in FIG. 10, all values of registers of all count value monitoring units A are reset to "0", and all values of registers of all count value monitoring units B are reset to "1" in synchronization with outputting the alarm.

The number of the registers for holding the count value may be increased. Accordingly, monitoring can be performed with a wider time window so that clock anomaly can be detected more reliably.

(Operation Example)

In the following, operation examples of the clock anomaly detection circuit of this embodiment are shown in time charts in FIGS. 13-25. In each time chart, case 1 indicates a case where H is obtained in the metastable state, and case 2 indicates a case where L is obtained in the metastable state.

Figure 13:
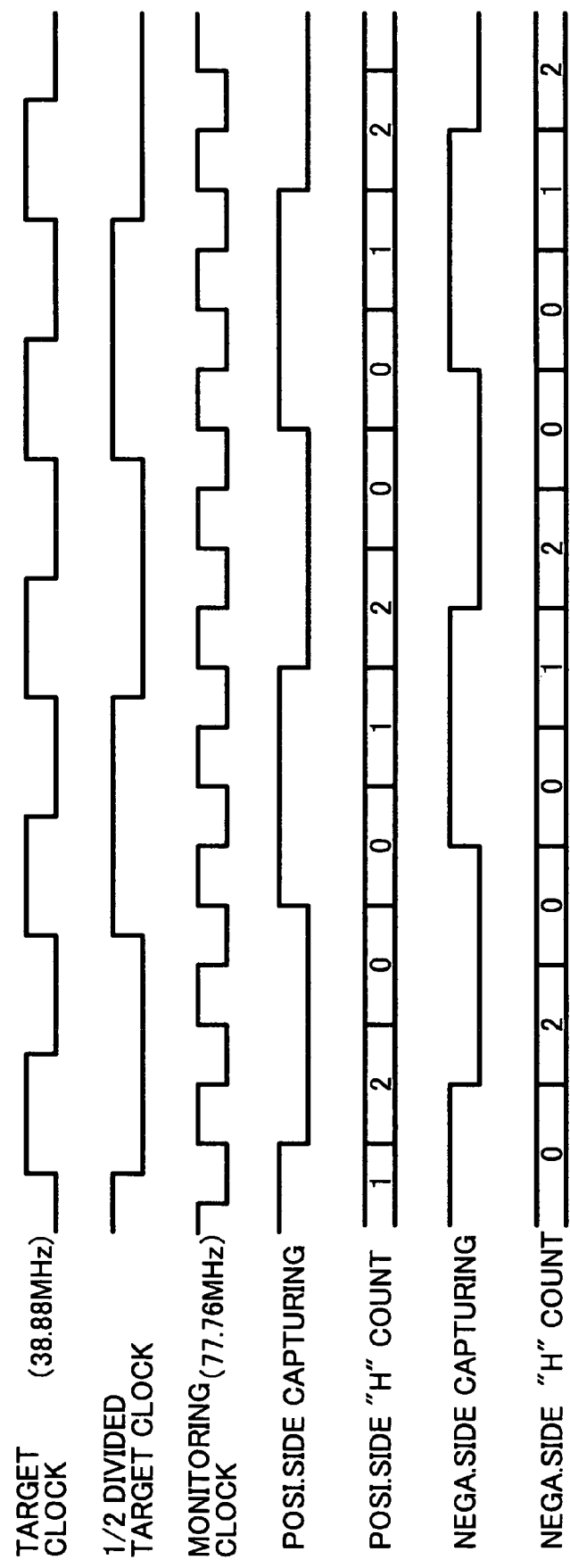
FIG. 13 is a time chart in a case where the target clock is normal and metastable state does not occur when obtaining the clock value.

FIG. 13 shows a time chart in a case where the target clock is normal and metastable state does not occur when obtaining the clock value. As shown in FIG. 13, regular count values ("0"→"1"→"2"→"0") are obtained in both of the rising edge side and the falling edge side.

Figure 14:
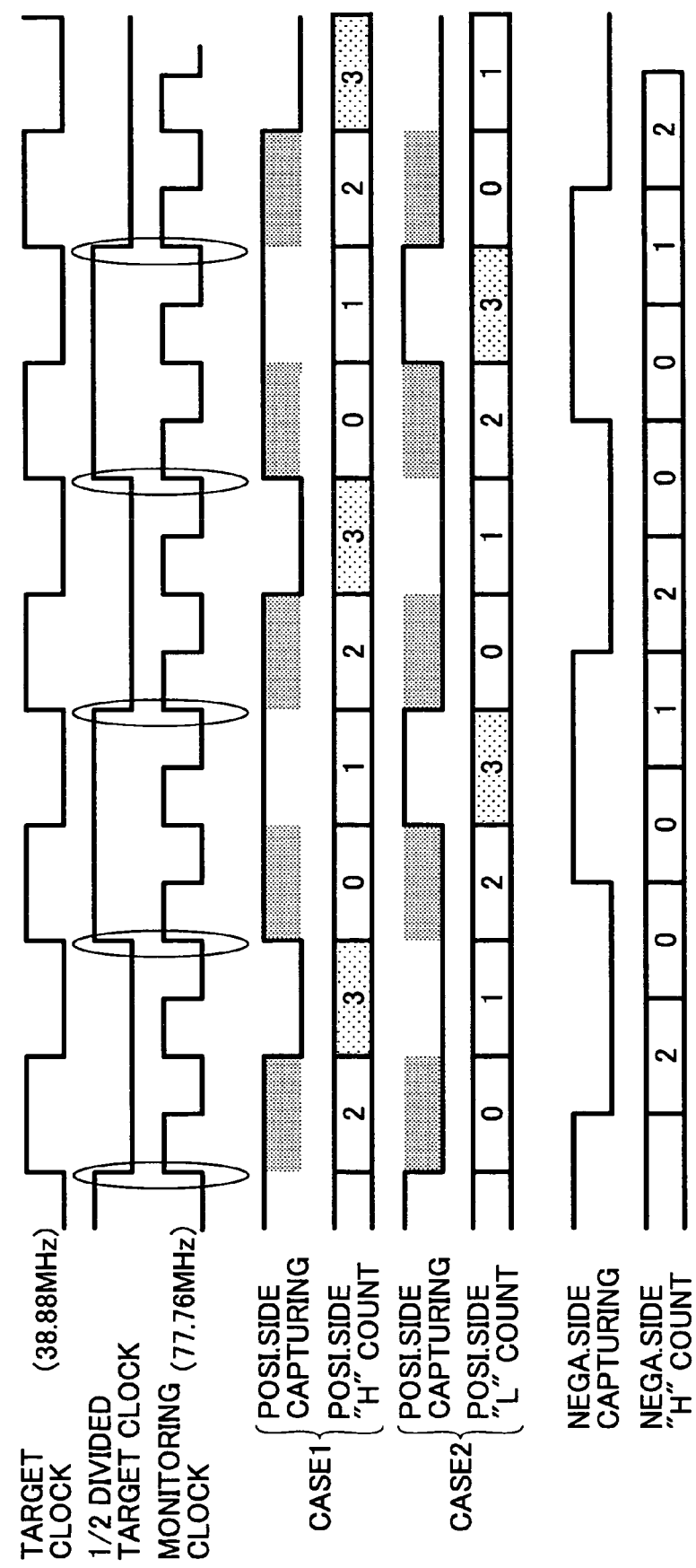
FIG. 14 is a time chart in a case where the target clock is normal but metastable state occurs when obtaining the clock value.

FIG. 14 shows a time chart in a case where the target clock is normal but metastable state occurs when obtaining the clock value. Although "3" appears in the rising edge use side where the metastable state occurs, since any abnormal value does not appear in the falling edge use side, the disturbance detection alarm does not occur.

Figure 15:
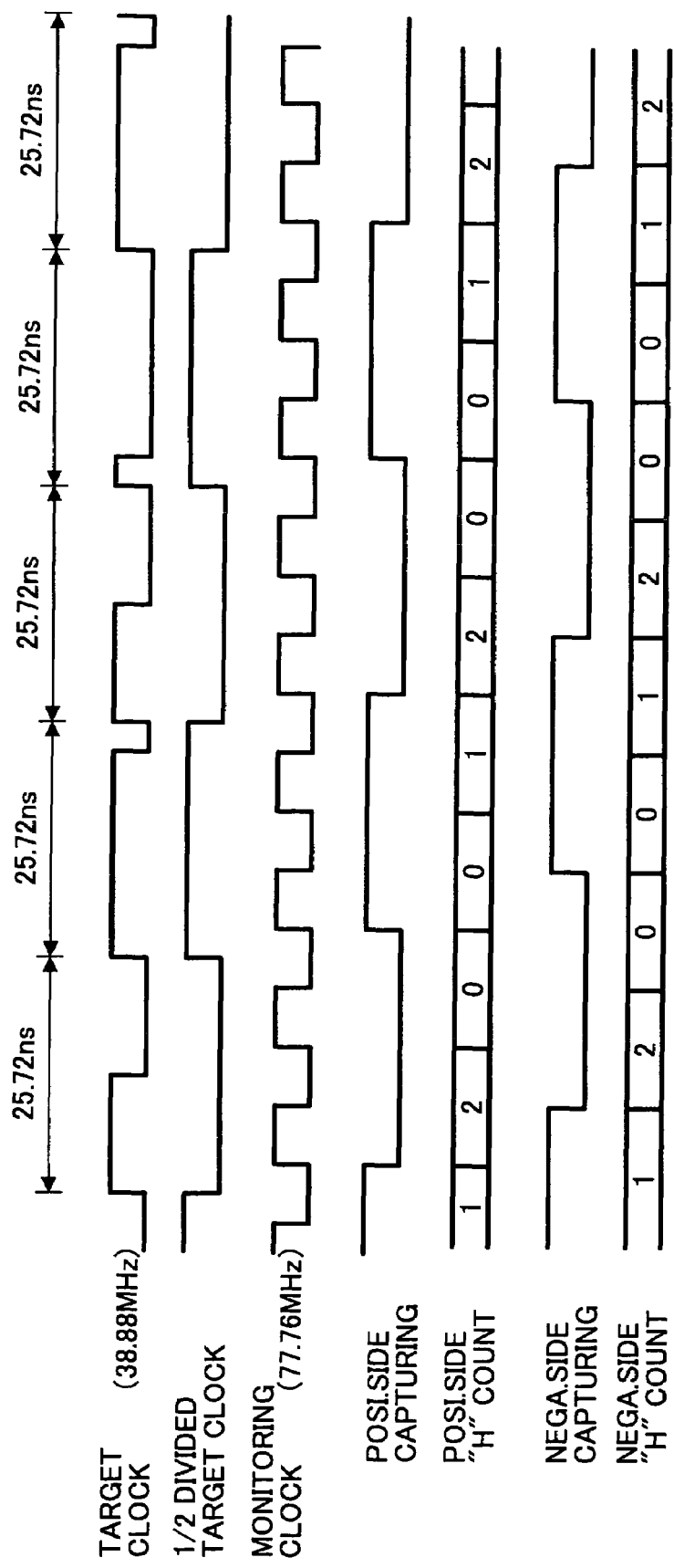
FIG. 15 is a time chart in a case where period of the target clock is normal but the Duty width changes.

FIG. 15 shows a time chart in a case where period of the target clock is normal but the Duty width changes. In this case, since the variation of the Duty width is eliminated by dividing the frequency of the target clock into half, the count value does not become abnormal.

Figure 16:
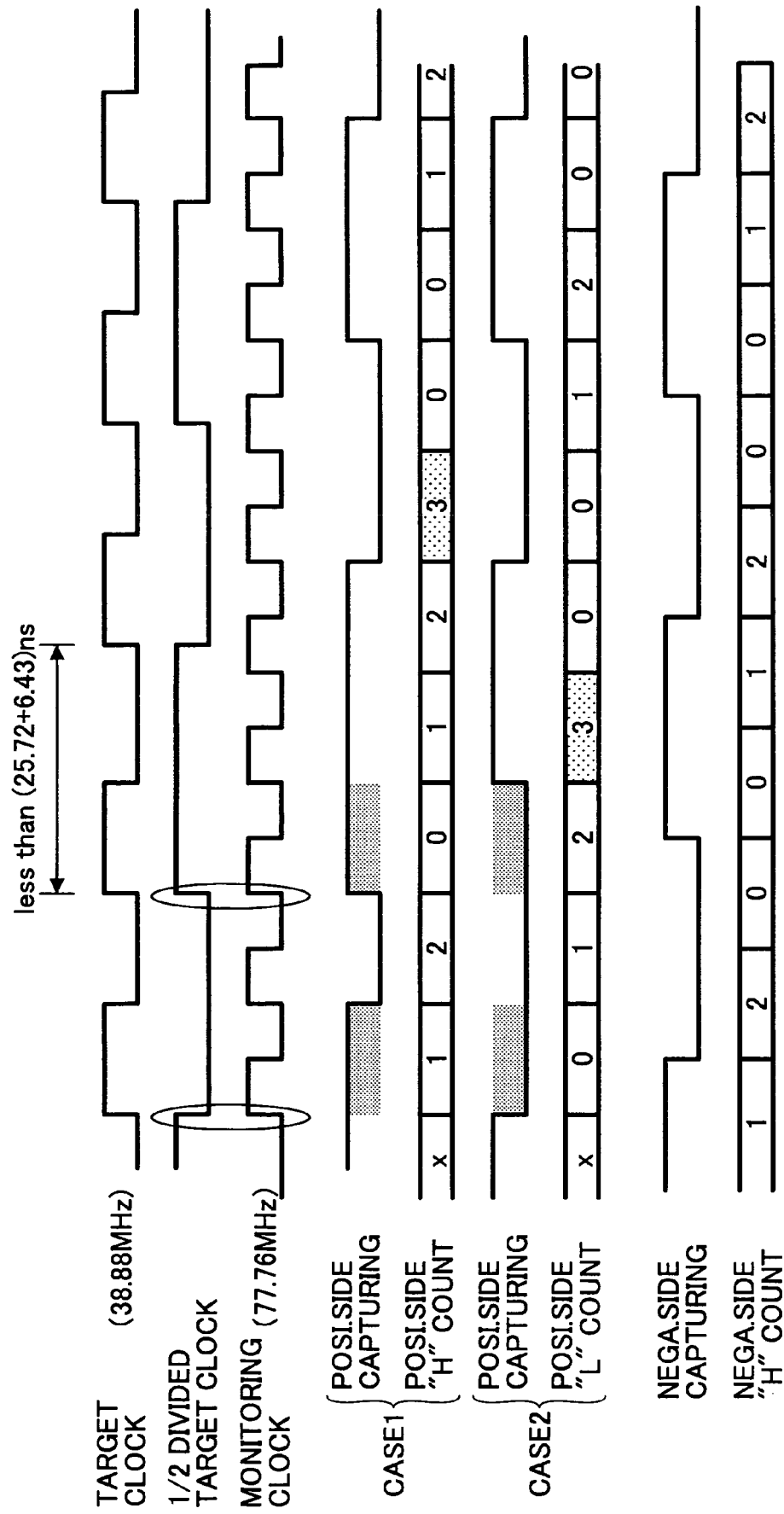
FIG. 16 is a time chart in a case where the period of the target clock lengthens but the increase of the length is less than 6.43 ns that is a detectable value.

FIG. 16 is a time chart in a case where the period of the target clock lengthens but the increase of the length is less than 6.43 ns that is a detectable value. In this case, although "3" appears in the rising edge use side, since any abnormal value does not appear in the falling edge use side, the disturbance detection alarm does not occur.

Figure 17:
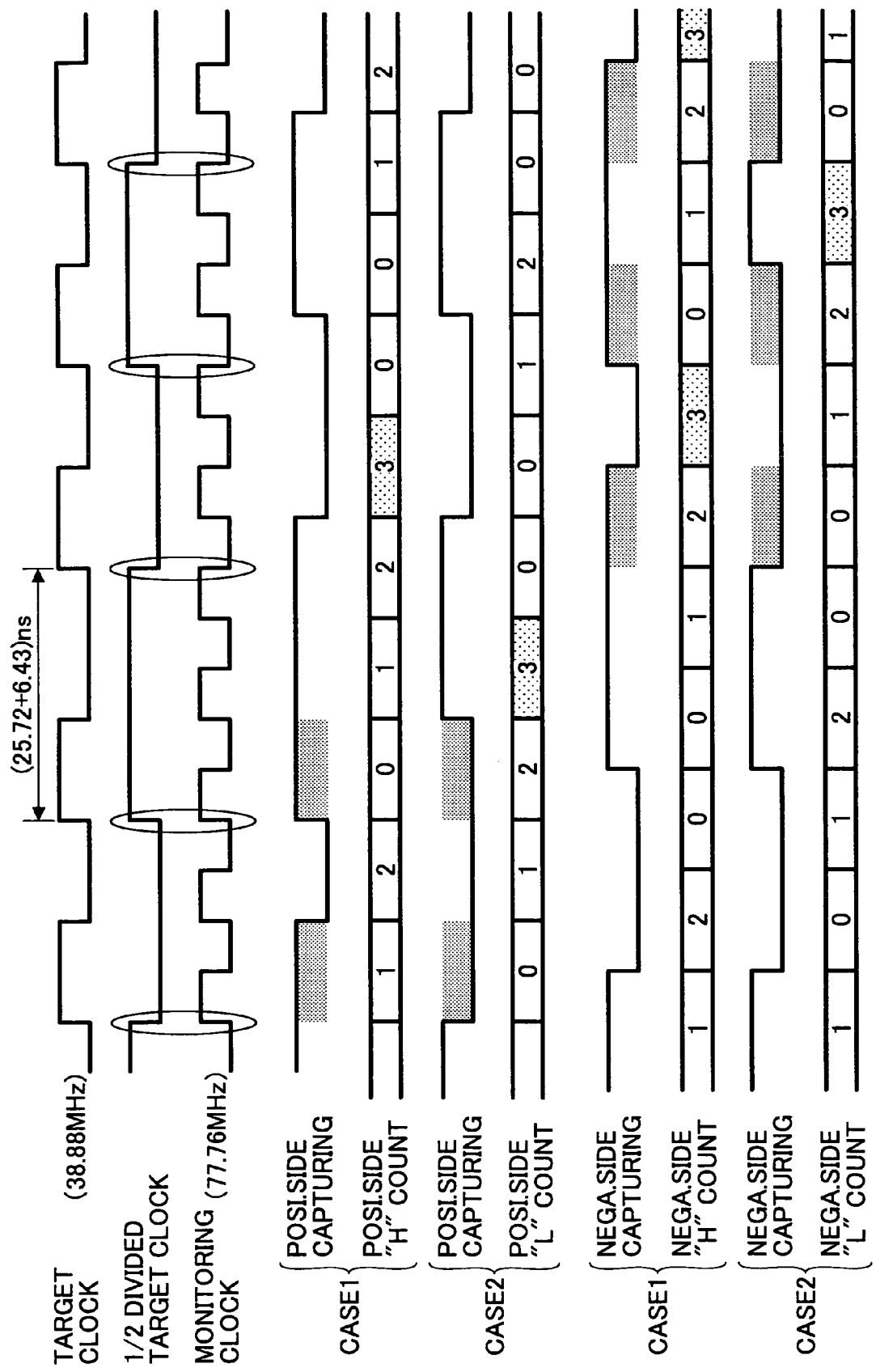
FIG. 17 is a time chart in a case where the increase of the period of the target clock is 6.43 ns.

FIG. 17 is a time chart in a case where the increase of the period of the target clock is 6.43 ns. In this case, "3" appears in both of the rising edge use side and the falling edge use side within the time window in either combination of case 1 and case 2 of the rising edge use side and case 1 and case 2 of the falling edge use side. Thus, the clock disturbance detection alarm occurs in this case.

Figure 18:
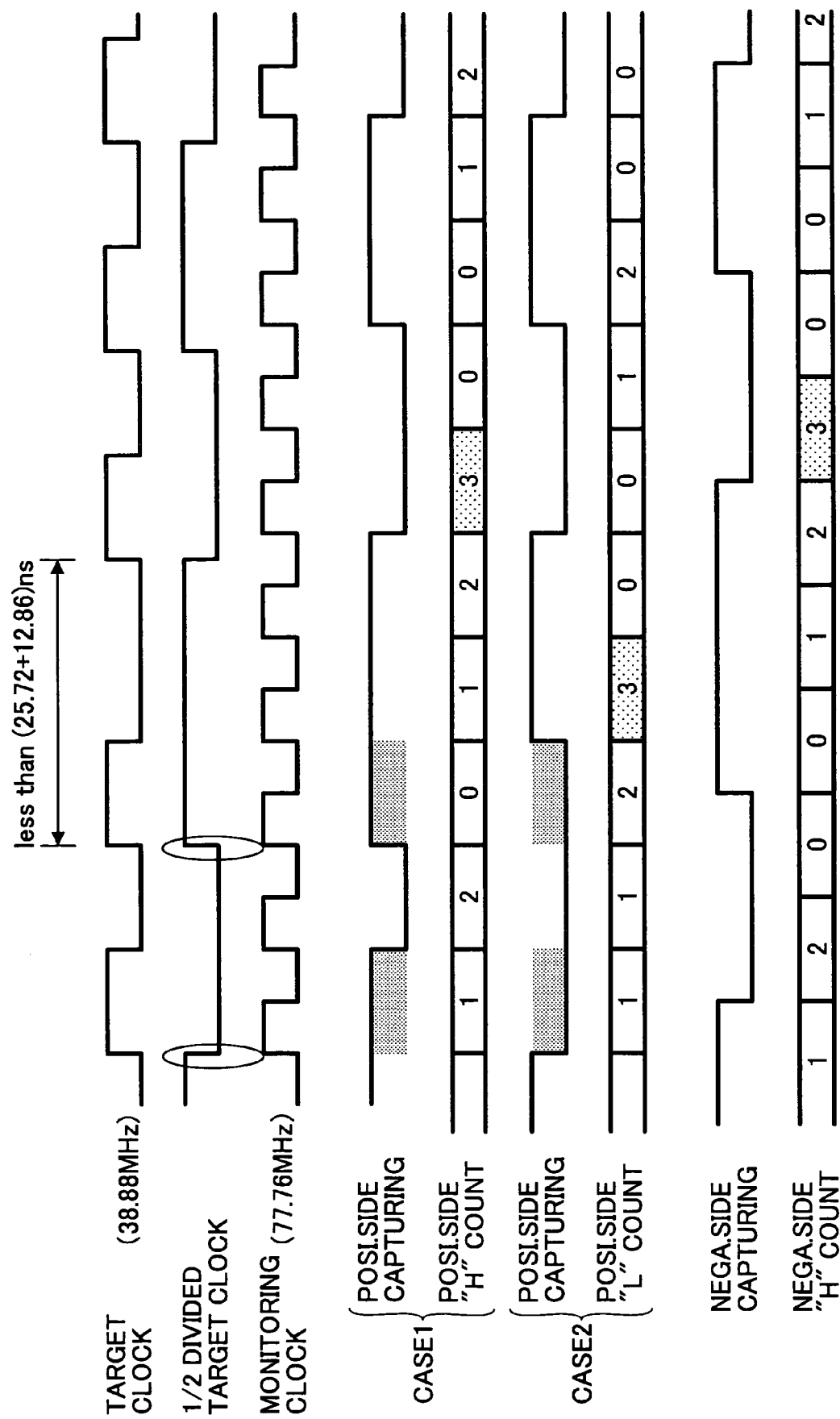
FIG. 18 is a time chart in a case where the increase of the period of the target clock is equal to or greater than 6.43 ns but less than 12.86 ns.

FIG. 18 is a time chart in a case where the increase of the period of the target clock is equal to or greater than 6.43 ns but less than 12.86 ns. Also in this case, "3" appears in both of the rising edge use side and the falling edge use side. Therefore, the clock disturbance detection alarm occurs in this case.

Figure 19:
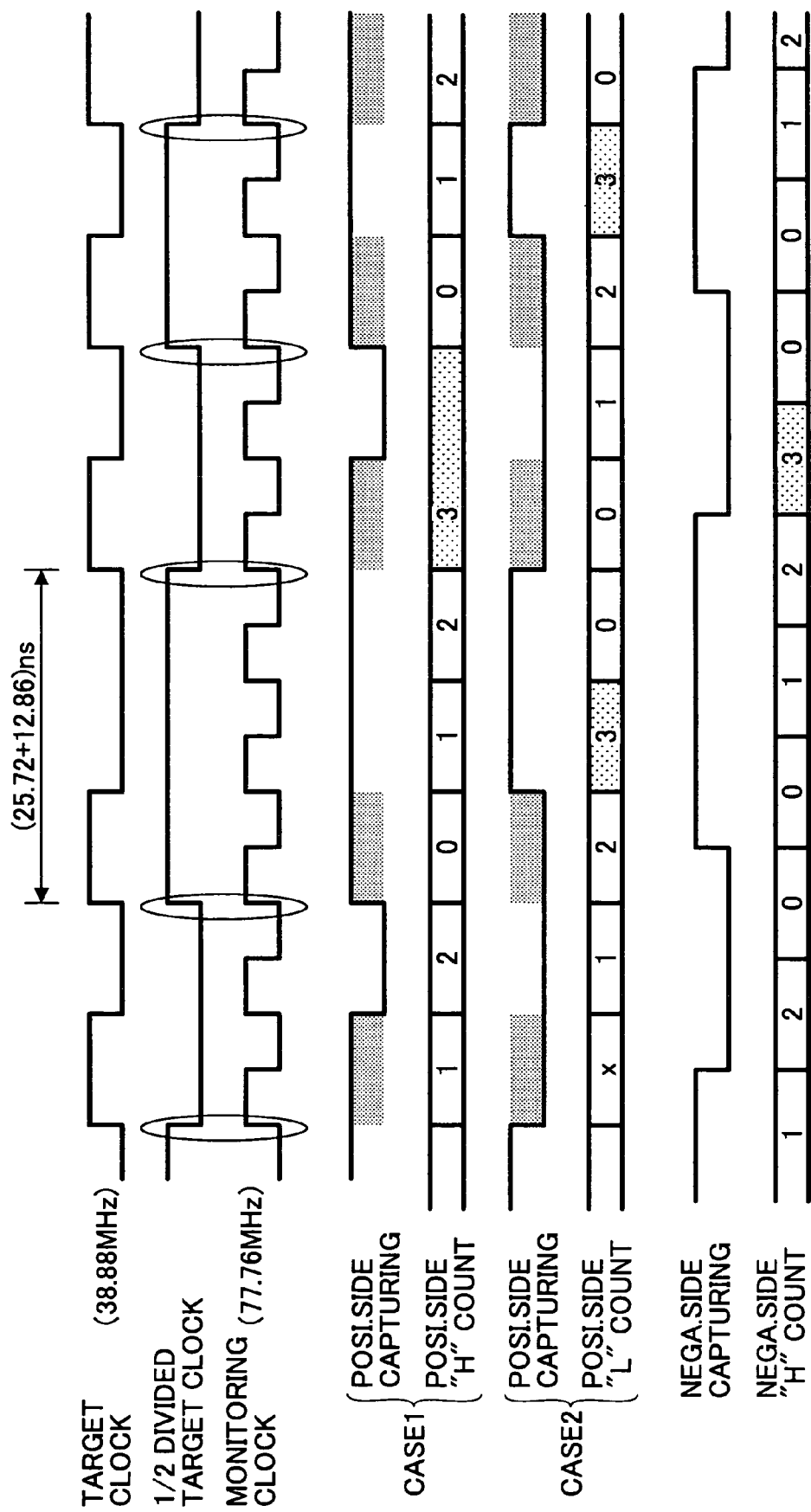
FIG. 19 is a time chart in a case where the increase of the period of the target clock is 12.86 ns.

FIG. 19 is a time chart in a case where the increase of the period of the target clock is 12.86 ns. Also in this case, "3" appears in both of the rising edge use side and the falling edge use side. Therefore, the clock disturbance detection alarm occurs in this case.

Figure 20:
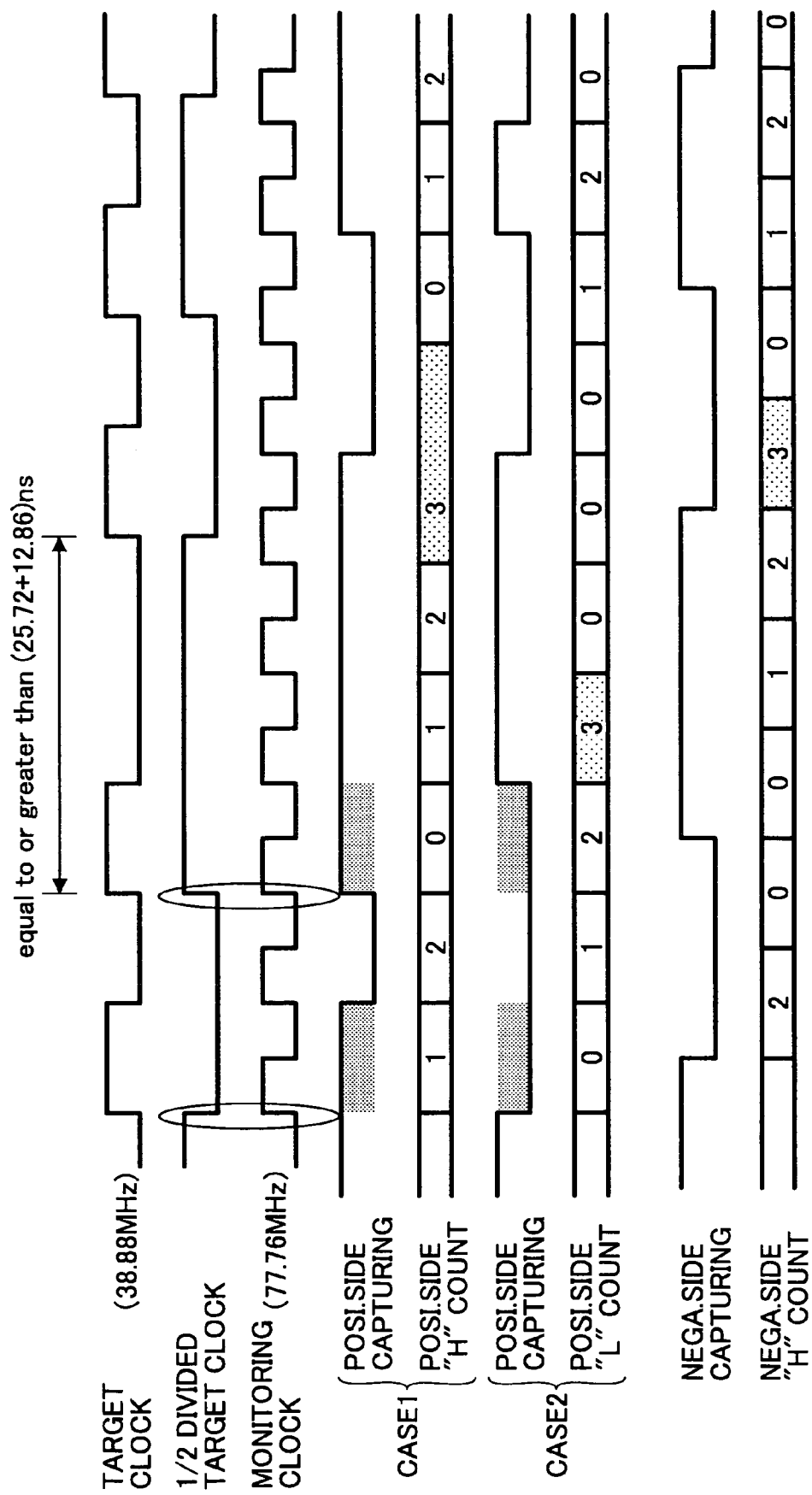
FIG. 20 is a time chart in a case where the increase of the period of the target clock is equal to or greater than 12.86 ns.

FIG. 20 is a time chart in a case where the increase of the period of the target clock is equal to or greater than 12.86 ns. Also in this case, "3" appears in both of the rising edge use side and the falling edge use side. Therefore, the clock disturbance detection alarm occurs in this case.

Figure 21:
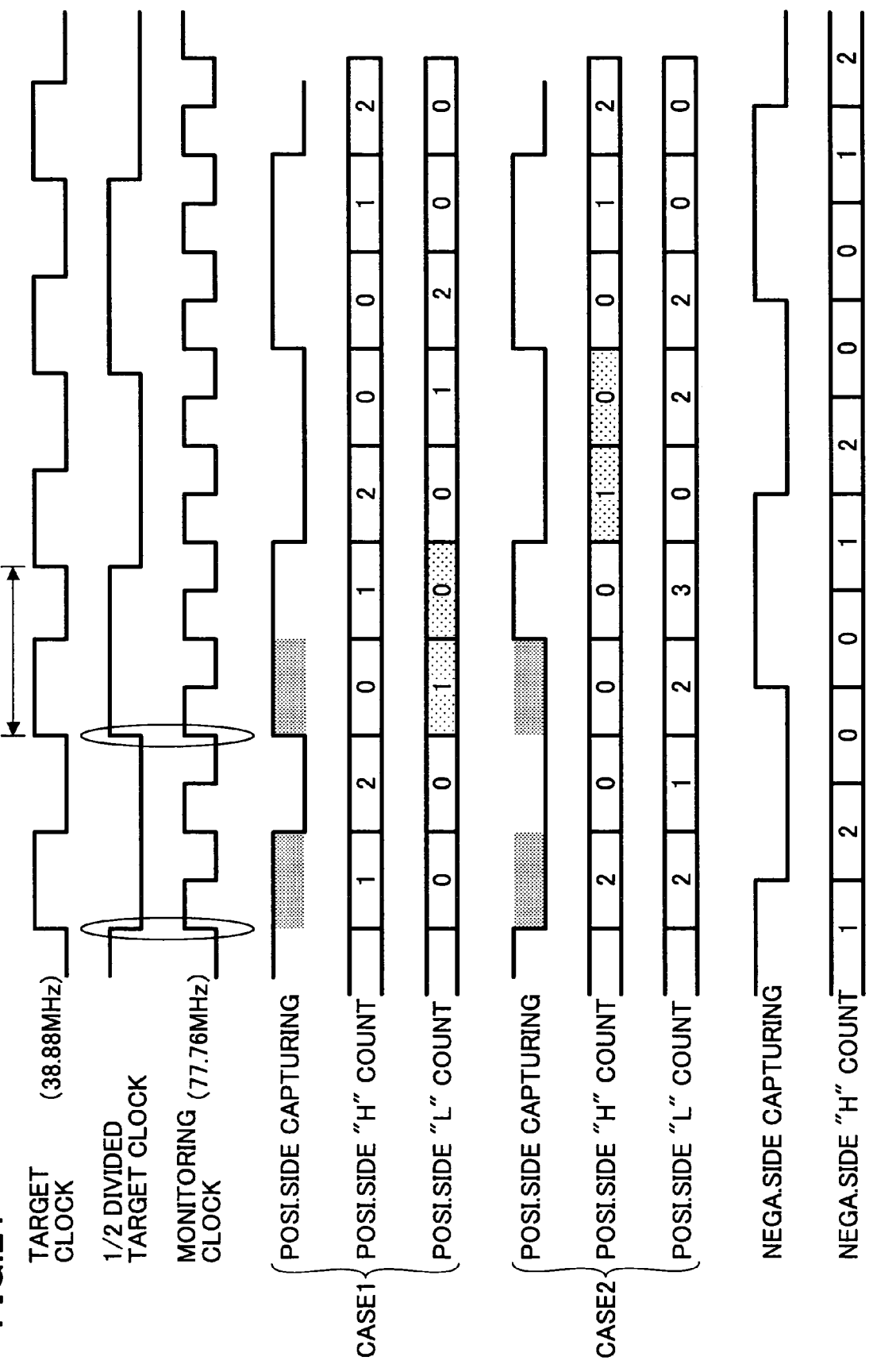
FIG. 21 is a time chart in a case where the period of the target clock shortens but the shrinkage is less than 6.43 ns that is a detectable value.

FIG. 21 is a time chart in a case where the period of the target clock shortens but the shrinkage is less than 6.43 ns that is a detectable value. In this case, although count value change of "1"→"0" occurs in the rising edge use side, since any abnormal value does not appear in the falling edge use side, the disturbance detection alarm does not occur.

Figure 22:
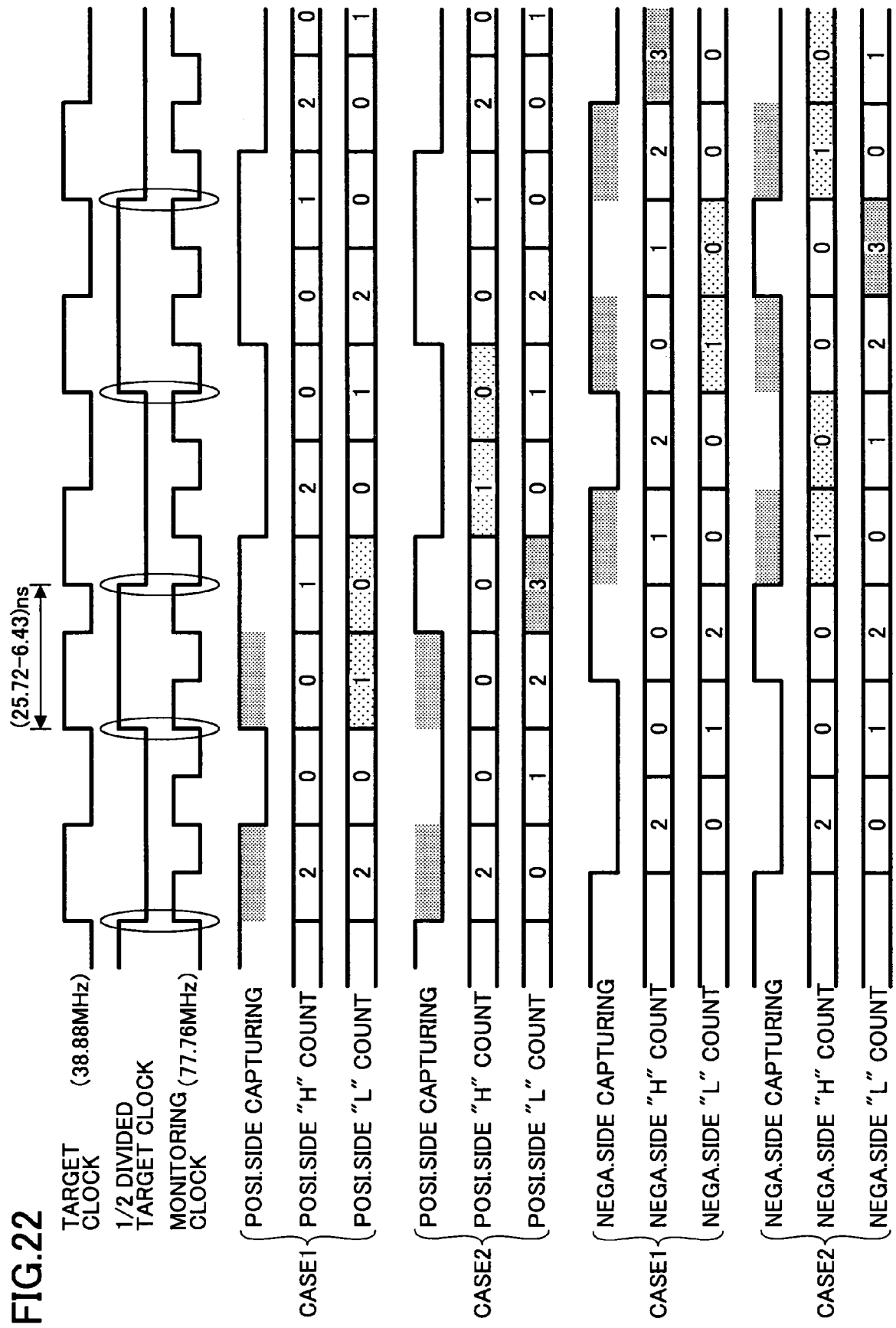
FIG. 22 is a time chart in a case where the shrinkage of the period of the target clock is 6.43 ns.

FIG. 22 is a time chart in a case where the shrinkage of the period of the target clock is 6.43 ns. In this case, "1"→"0" appears in both of the rising edge use side and the falling edge use side within the time window in either combination of case 1 and case 2 of the rising edge use side and case 1 and case 2 of the falling edge use side. Thus, the clock disturbance detection alarm occurs in this case.

Figure 23:
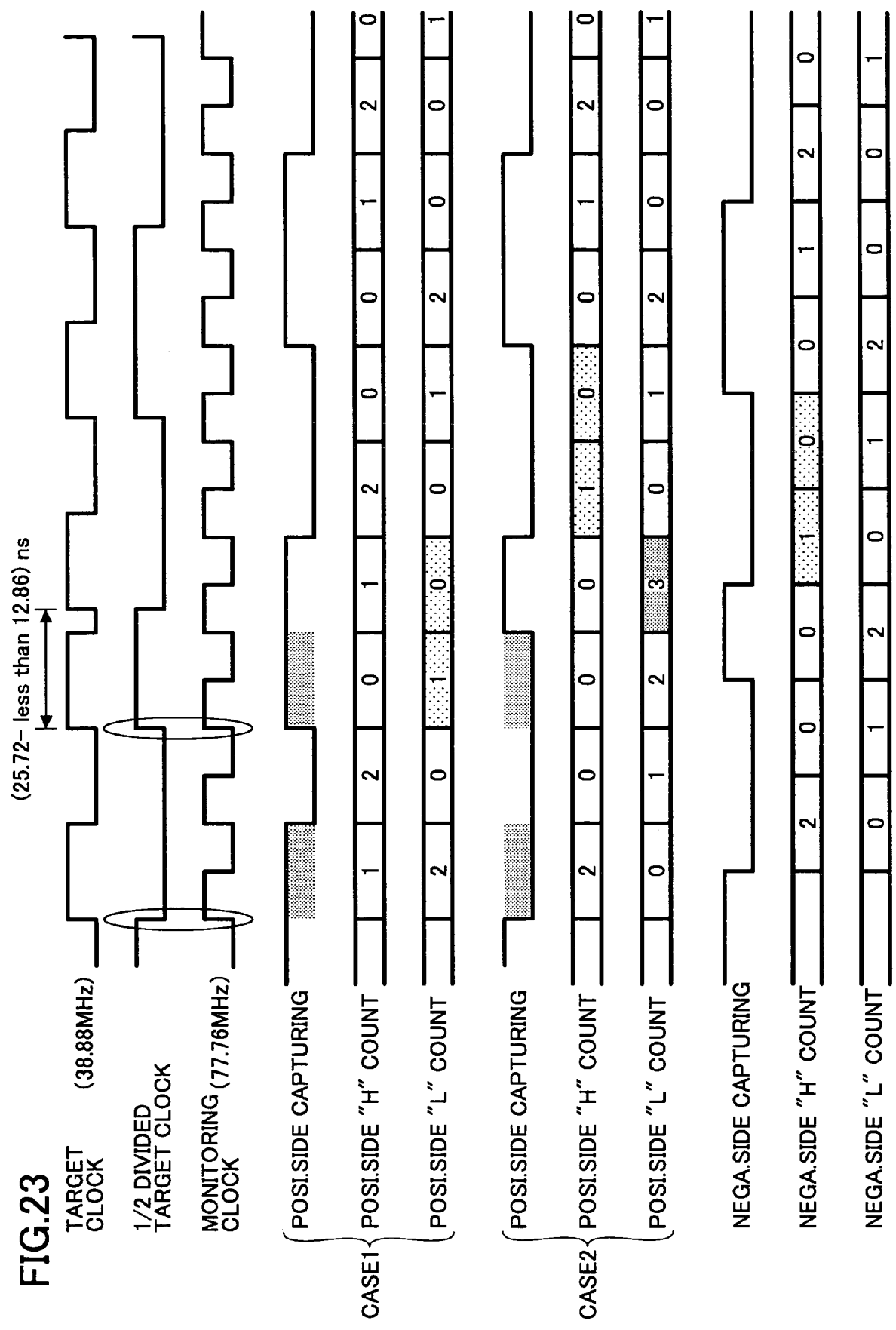
FIG. 23 is a time chart in a case where the shrinkage of the period of the target clock is equal to or greater than 6.43 ns but less than 12.86 ns.

FIG. 23 is a time chart in a case where the shrinkage of the period of the target clock is equal to or greater than 6.43 ns but less than 12.86 ns. Also in this case, "1"→"0" appears in both of the rising edge use side and the falling edge use side. Therefore, the clock disturbance detection alarm occurs in this case.

Figure 24:
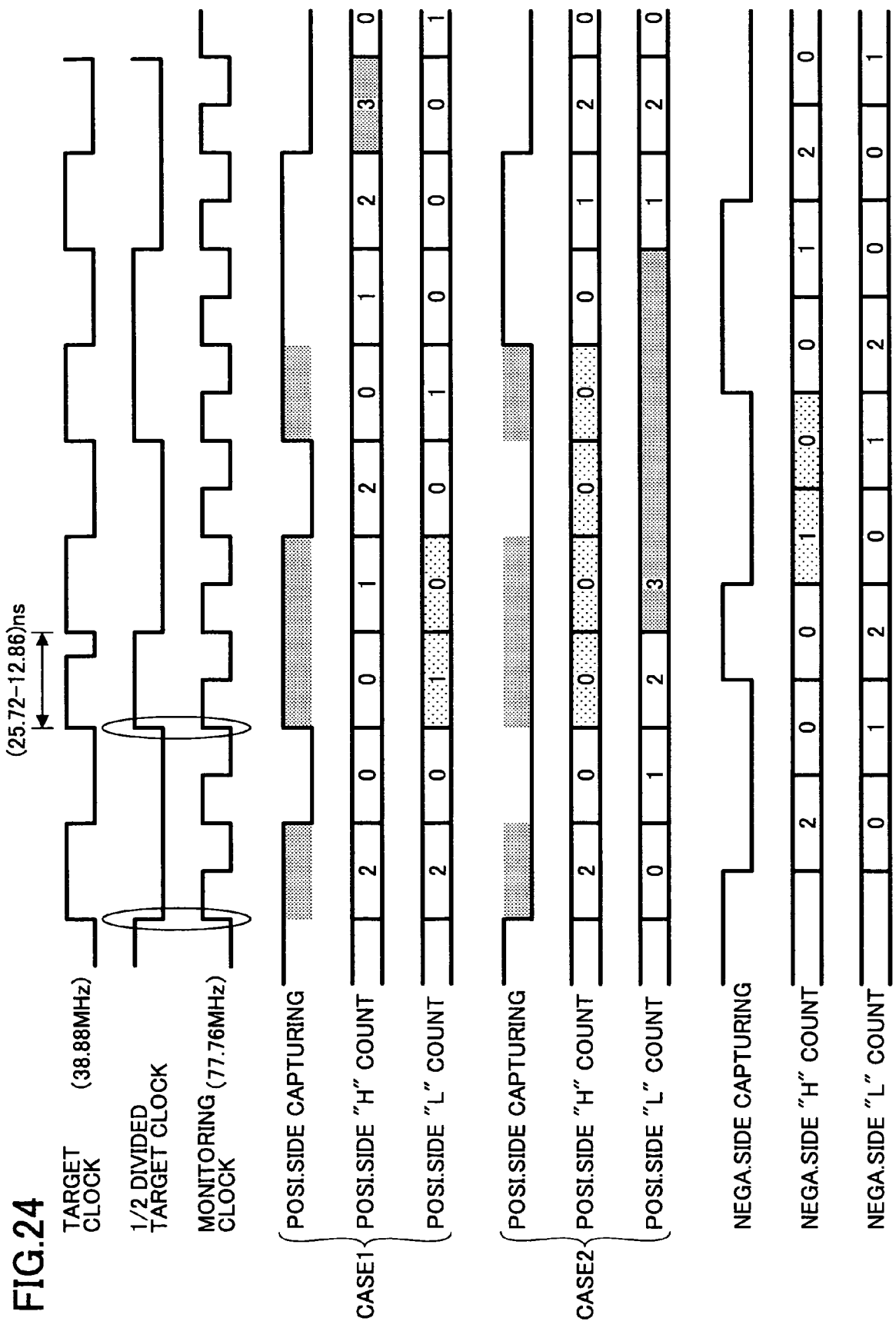
FIG. 24 is a time chart in a case where the shrinkage of the period of the target clock is 12.86 ns.

FIG. 24 is a time chart in a case where the shrinkage of the period of the target clock is 12.86 ns. Also in this case, "1"→"0" appears in both of the rising edge use side and the falling edge use side. Therefore, the clock disturbance detection alarm occurs in this case.

Figure 25:
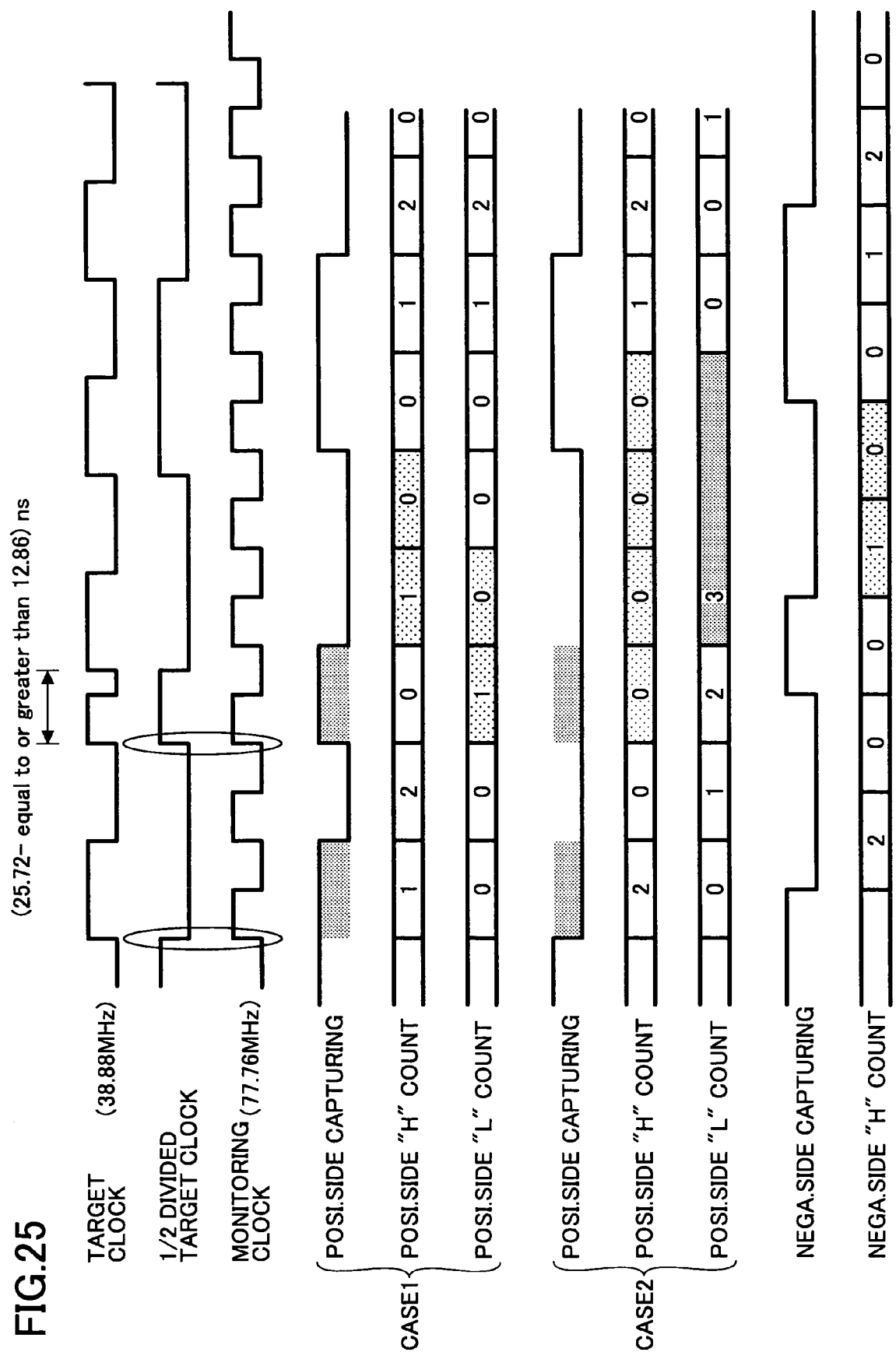
FIG. 25 is a time chart in a case where the shrinkage of the period of the target clock is equal to or greater than 12.86 ns.

FIG. 25 is a time chart in a case where the shrinkage of the period of the target clock is equal to or greater than 12.86 ns. Also in this case, "1"→"0" or "0"→"0"→"0"→"0" appears in both of the rising edge use side and the falling edge use side. Therefore, the clock disturbance detection alarm occurs in this case.

As described above, by the clock anomaly detection circuit of the present embodiment, clock anomaly can be detected with very high precision.

In addition, for example, a clock failure-resistant and high-quality apparatus can be provided by configuring the apparatus to include an active circuit having a target clock generation unit; a standby circuit having a target clock generation unit; the clock anomaly detection circuit of the present embodiment; and a unit for switching the active circuit to the standby circuit when the clock anomaly detection circuit detects anomaly of the clock generated by the target clock generation unit of the active circuit.

The present invention is not limited to the specifically disclosed embodiments, and variations and modifications may be made without departing from the scope of the present invention.

The present application contains subject matter related to Japanese patent application No. 2006-122155, filed in the JPO on Apr. 26, 2006, the entire contents of which are incorporated herein by reference.

What is claimed is:

1. A clock anomaly detection circuit comprising:
a dividing unit configured to output a divided target clock by dividing frequency of a target clock;
a first time width measurement unit configured to obtain values of the divided target clock using rising edges of a monitoring clock that is synchronized with the target clock, and to measure an H level time with and an L level time width;
a second time width measurement unit configured to obtain values of the divided target clock using falling edges of the monitoring clock, and to measure an H level time with and an L level time width; and
an anomaly determination unit configured to determine that the target clock is abnormal when an anomaly is detected in the H level time width or the L level time width measured in the first time width measurement unit and when an anomaly is detected in the H level time width or the L level time width measured in the second time width measurement unit.

2. The clock anomaly detection circuit as claimed in claim 1, wherein, when it is assumed that the target clock is abnormal when the period of the target clock changes from a normal value by equal to or greater than a predetermined time width, a clock of a period twice as long as the predetermined time width is used as the monitoring clock.

3. The clock anomaly detection circuit as claimed in claim 1, wherein each of the first time width measurement unit and the second time width measurement unit comprises:
an H level counter configured to count the number of monitoring clocks within a period of H level as the H level time width; and
an L level counter configured to count the number of monitoring clocks within a period of L level as the L level time width.

4. The clock anomaly detection circuit as claimed in claim 3, the anomaly determination unit comprising:
a first count value anomaly detection unit connected to the H level counter of the first time width measurement unit;
a second count value anomaly detection unit connected to the L level counter of the first time width measurement unit;
a third count value anomaly detection unit connected to the H level counter of the second time width measurement unit; and a fourth count value anomaly detection unit connected to the L level counter of the second time width measurement unit, and each of the first to fourth count value anomaly detection units comprising:

a period lengthening detection unit configured to detect anomaly of the count value when the period of the target clock lengthens; and a period shortening detection unit configured to detect anomaly of the count value when the period of the target clock shortens.

5. A clock anomaly detection method comprising:

a dividing step of outputting a divided target clock by dividing frequency of a target clock;

a first time width measurement step of obtaining values of the divided target clock using rising edges of a monitoring clock that is synchronized with the target clock, and measuring an H level time with and an L level time width;

a second time width measurement step of obtaining values of the divided target clock using falling edges of the monitoring clock, and measuring an H level time with and an L level time width; and an anomaly determination step of determining that the target clock is abnormal when an anomaly is detected in the H level time width or the L level time width measured in the first time width measurement step and when an anomaly is detected in the H level time width or the L level time width measured in the second time width measurement step.

6. The clock anomaly detection method as claimed in claim 5, wherein, when it is assumed that the target clock is abnormal when the period of the target clock changes from a normal value by equal to or greater than a predetermined time width, a clock of a period twice as long as the predetermined time width is used as the monitoring clock.

7. The clock anomaly detection method as claimed in claim 5, wherein each of the first time width measurement step and the second time width measurement step comprises:

an H level counting step of counting the number of monitoring clocks within a period of H level as the H level time width; and an L level counting step of counting the number of monitoring clocks within a period of L level as the L level time width.

8. The clock anomaly detection method as claimed in claim 7, the anomaly determination step comprising:

monitoring anomaly of the count value where the period of the target clock lengthens and anomaly of the count value where the period of the target clock shortens for each of H level and L level in each of the first time width measurement step and the second time width measurement step.

* * * * *

UNITED STATES PATENT AND TRADEMARK OFFICE
CERTIFICATE OF CORRECTION

PATENT NO. : 7,391,240 B2 Page 1 of 1
APPLICATION NO. : 11/503169
DATED : June 24, 2008
INVENTOR(S) : Shosaku Yamasaki It is certified that error appears in the above-identified patent and that said Letters Patent is hereby corrected as shown below:

Title Page; item (57);

First Page, Column 2 (Abstract), Line 6, change "with" to --width--.

First Page, Column 2 (Abstract), Line 10, change "with" to --width--.

Column 10, Line 29, change "with" to --width--.

Column 10, Line 34, change "with" to --width--.

Column 11, Line 18, change "with" to --width--.

Column 11, Line 22, change "with" to --width--.

Signed and Sealed this

Twenty-eighth Day of October, 2008

JON W. DUDAS
*Director of the United States Patent and Trademark Office*